(12) United States Patent
Chin et al.

(10) Patent No.: US 11,742,290 B2
(45) Date of Patent: Aug. 29, 2023

(54) INTERCONNECT STRUCTURE AND METHOD OF FORMING THEREOF

(71) Applicant: Taiwan Semiconductor Manufacturing Co., Ltd., Hsinchu (TW)

(72) Inventors: Shu-Cheng Chin, Hsinchu (TW); Ming-Yuan Gao, Hsinchu (TW); Chen-Yi Niu, Hsinchu (TW); Yen-Chun Lin, Hsinchu (TW); Hsin-Ying Peng, Hsinchu (TW); Chih-Hsiang Chang, Hsinchu (TW); Pei-Hsuan Lee, Taipei (TW); Chi-Feng Lin, Hsinchu (TW); Chih-Chien Chi, Hsinchu (TW); Hung-Wen Su, Jhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 123 days.

(21) Appl. No.: 17/242,783

(22) Filed: Apr. 28, 2021

(65) Prior Publication Data
US 2022/0293528 A1 Sep. 15, 2022

Related U.S. Application Data

(60) Provisional application No. 63/158,991, filed on Mar. 10, 2021.

(51) Int. Cl.
*H01L 23/532* (2006.01)
*H01L 21/8234* (2006.01)
(Continued)

(52) U.S. Cl.
CPC .. *H01L 23/53238* (2013.01); *H01L 21/76846* (2013.01); *H01L 21/76883* (2013.01);
(Continued)

(58) Field of Classification Search
CPC ......... H01L 21/76871; H01L 21/76846; H01L 21/76883; H01L 21/76805; H01L 21/823475
See application file for complete search history.

(56) References Cited

U.S. PATENT DOCUMENTS 6,344,410 B1 *   2/2002   Lopatin ............ H01L 23/53238
                                                     438/653
8,178,437 B2    5/2012   Chang et al.
(Continued)

FOREIGN PATENT DOCUMENTS

DE   112010003659 T5   10/2012
TW      200620401 A    6/2006
TW      201926618 A    7/2019

OTHER PUBLICATIONS

U.S. Appl. No. 17/001,917, filed Aug. 25, 2020.
U.S. Appl. No. 17/066,706, filed Oct. 9, 2020.

*Primary Examiner* — Changhyun Yi
(74) *Attorney, Agent, or Firm* — Slater Matsil, LLP

(57) ABSTRACT

A method of manufacturing an interconnect structure includes forming an opening through a dielectric layer. The opening exposes a top surface of a first conductive feature. The method further includes forming a barrier layer on sidewalls of the opening, passivating the exposed top surface of the first conductive feature with a treatment process, forming a liner layer over the barrier layer, and filling the opening with a conductive material. The liner layer may include ruthenium.

20 Claims, 29 Drawing Sheets

(51) Int. Cl.
    *H01L 23/528*   (2006.01)
    *H01L 23/522*   (2006.01)
    *H01L 21/768*   (2006.01)
    *H01L 29/78*    (2006.01)
    *H01L 29/66*    (2006.01)
    *H01L 29/06*    (2006.01)
    *H01L 29/423*   (2006.01)
    *H01L 29/786*   (2006.01)
    *H01L 27/088*   (2006.01)

(52) U.S. Cl.
    CPC .......... *H01L 21/823431* (2013.01); *H01L 21/823475* (2013.01); *H01L 23/5226* (2013.01); *H01L 23/5283* (2013.01); *H01L 27/0886* (2013.01); *H01L 29/0673* (2013.01); *H01L 29/0676* (2013.01); *H01L 29/42392* (2013.01); *H01L 29/66439* (2013.01); *H01L 29/66742* (2013.01); *H01L 29/66795* (2013.01); *H01L 29/786* (2013.01); *H01L 29/7851* (2013.01)

(56) References Cited

U.S. PATENT DOCUMENTS

| | | | |
|---|---|---|---|
| 10,790,142 | B2 | 9/2020 | Chi et al. |
| 11,018,055 | B2 | 5/2021 | Yang et al. |
| 2009/0206485 | A1* | 8/2009 | Yang .............. H01L 23/5329 |
| | | | 257/E23.161 |
| 2010/0081271 | A1 | 4/2010 | Ishizaka et al. |
| 2010/0148366 | A1 | 6/2010 | Yang et al. |
| 2011/0062587 | A1 | 3/2011 | Yang et al. |
| 2020/0098619 | A1 | 3/2020 | Marieb et al. |
| 2020/0235006 | A1 | 7/2020 | Wu et al. |
| 2020/0357690 | A1* | 11/2020 | Park .............. H01L 21/76843 |
| 2021/0013146 | A1 | 1/2021 | Wang et al. |

* cited by examiner

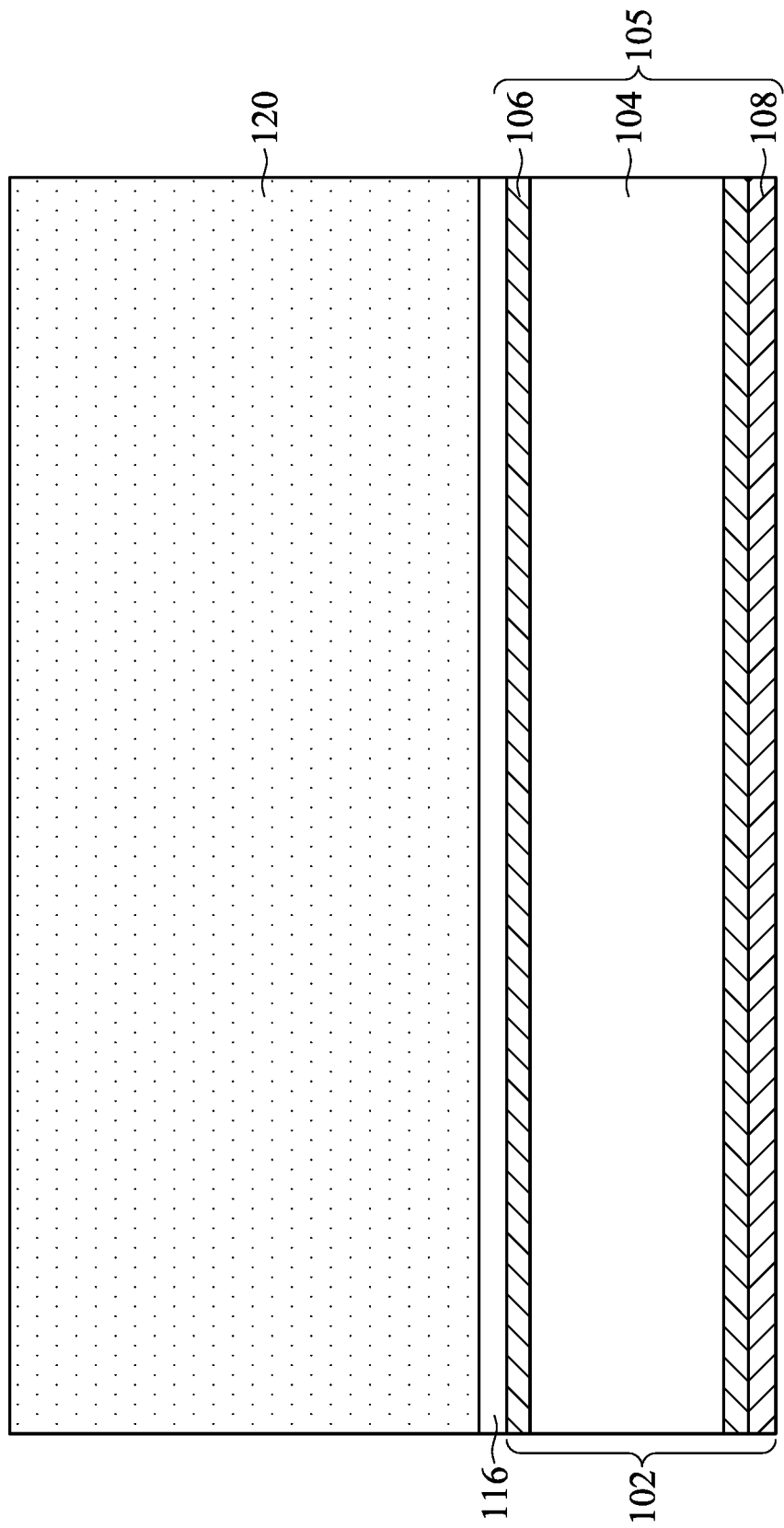

INTERCONNECT STRUCTURE AND METHOD OF FORMING THEREOF

PRIORITY CLAIM AND CROSS-REFERENCE

This application claims the benefit of U.S. Provisional Application No. 63/158,991, filed on Mar. 10, 2021, which application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
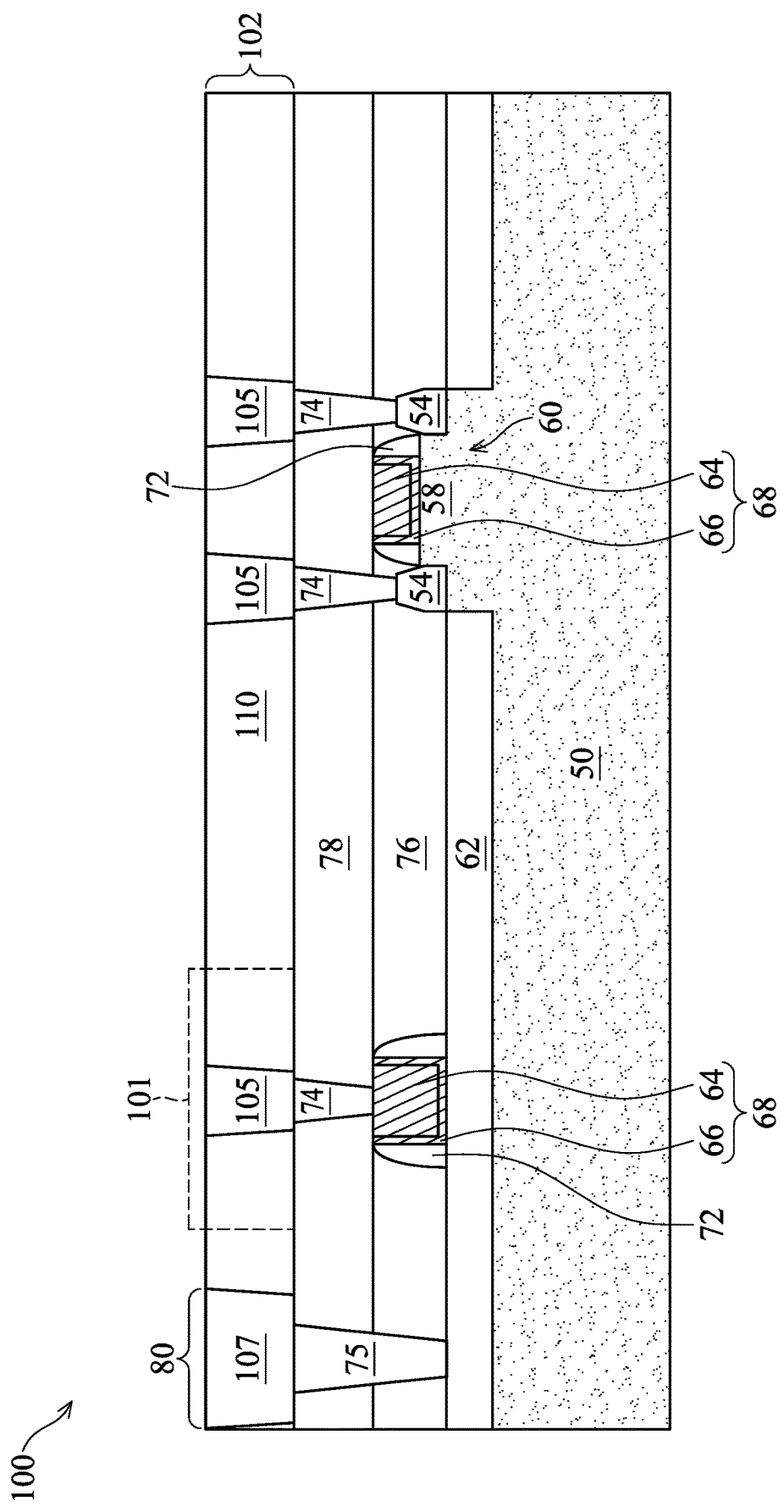
FIG. 1A illustrates a cross-sectional view of a semiconductor substrate and interconnect structures of an integrated circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure includes, for example, embodiments of interconnect structures having conductive features with a barrier layer, multiple liner layers, and a conductive fill material. The barrier layer is formed to not cover the bottom surfaces of the conductive features, which decreases device resistance. A treatment process passivates the exposed bottom surface not covered by the barrier layer, which reduces corrosion that may occur from reactions between the subsequently formed liner layers and the exposed bottom surface. The multiple liner layers may be intermixed on sidewalls of the conductive features, which can improve adhesion of the conductive fill material.

Figure 1B:
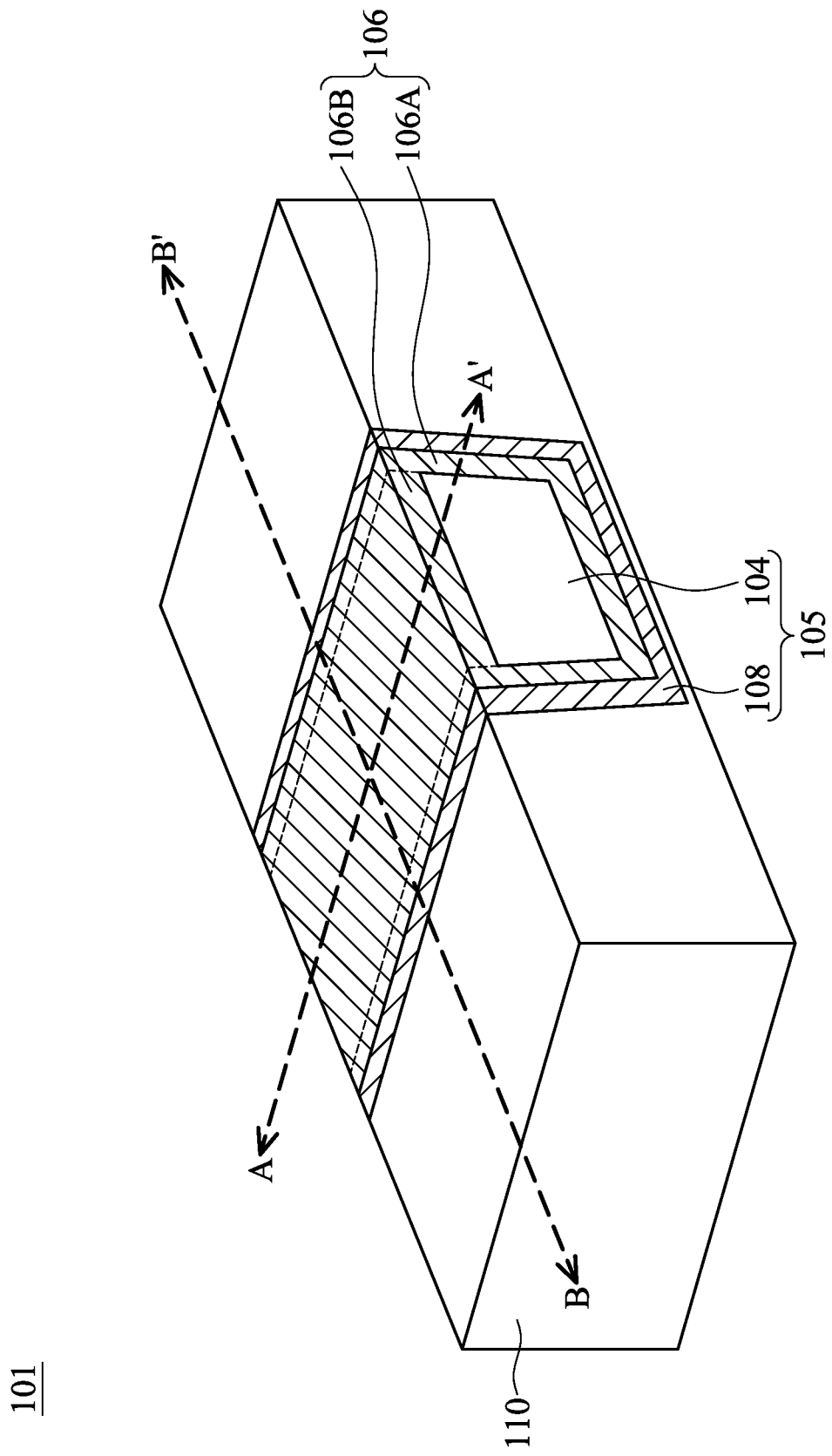
FIG. 1B illustrates a perspective view of an interconnect structure at an intermediate stage of manufacturing, in accordance with some embodiments.

FIG. 1A illustrates a cross-sectional view of a semiconductor structure 100 comprising a substrate 50 in which various electronic devices may be formed, and a portion of a multilevel interconnect system (e.g., interconnect level 102) formed over the substrate 50, in accordance with some embodiments. FIG. 1B illustrates a detailed perspective view of region 101 as shown in FIG. 1A. Generally, as will be discussed in greater detail below, FIG. 1A illustrates a FinFET device 60 formed on a substrate 50, with multiple interconnection layers formed thereover.

Generally, the substrate 50 illustrated in FIG. 1A may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, MN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

The FinFET device 60 illustrated in FIG. 1A is a three-dimensional MOSFET structure formed in fin-like strips of semiconductor protrusions 58 referred to as fins. The cross-section shown in FIG. 1A is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 50 using, for example, reactive ion etching (RIE). FIG. 1A illustrates a single fin 58, although the substrate 50 may comprise any number of fins.

Shallow trench isolation (STI) regions 62 formed along opposing sidewalls of the fin 58 are illustrated in FIG. 1A. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner (not shown) such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fins 58 protrudes from surrounding insulating STI regions 62. In some cases, the patterned hard mask used to form the fins 58 may also be removed by the planarization process.

In some embodiments, the gate structure 68 of the FinFET device 60 illustrated in FIG. 1A is a high-k, metal gate (HKMG) gate structure that may be formed using a gate-last process flow. In a gate last process flow a sacrificial dummy gate structure (not shown) is formed after forming the STI regions 62. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 62. As described in greater detail below, the dummy gate structure may be replaced by the high-k metal gate (HKMG) gate structure 68 as illustrated in FIG. 1A. The HKMG gate structure 68 illustrated in the right side in FIG. 1A (seen on the top of fin 58) is an example of an active HKMG gate structure which extends, e.g., along sidewalls of and over a the portion of fin 58 protruding above the STI regions 62, and the HKMG gate structure 68 in the left side in FIG. 1A is an example gate structure extending over the STI region 62, such as between adjacent fins. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET 60, illustrated in FIG. 1A, are formed, for example, self-aligned to the dummy gate structures. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin (as illustrated in the right side of FIG. 1A) or the surface of the STI dielectric (as illustrated in the left side of FIG. 1A).

Source and drain regions 54 are semiconductor regions in contact with the semiconductor fin 58. In some embodiments, the source and drain regions 54 may comprise heavily-doped regions and relatively lightly-doped drain extensions, or LDD regions. Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may comprise an epitaxially grown region. For example, after forming the LDD regions, the spacers 72 may be formed and, subsequently, the heavily-doped source and drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 1A. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm$^{-2}$ to $10^{16}$ cm$^{-2}$) of dopants may be introduced into the heavily-doped source and drain regions 54 either in situ during SEG, or by an ion implantation process performed after the SEG, or by a combination thereof.

An interlayer dielectric (ILD) layer 76 (seen in FIG. 1A) is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the ILD layer 76. The HKMG gate structures 68, illustrated in FIG. 1A, may then be formed by first removing the dummy gate structures using one or more etching techniques, thereby creating recesses between respective spacers 72.

Next, a replacement gate dielectric layer 66 comprising one or more dielectrics, followed by a replacement conductive gate layer 64 comprising one or more conductive materials, are deposited to completely fill the recesses. The gate dielectric layer 66 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the conductive gate layer 64 may be a multilayered metal gate stack comprising a barrier layer, a work function layer, and a gate-fill layer formed successively on top of gate dielectric layer 66. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like. Excess portions of the gate structure layers 64 and 66 may be removed from over the top surface of the ILD layer 76 using, for example a CMP process. The resulting structure, as illustrated in FIG. 1A, may be a substantially coplanar surface comprising an exposed top surface of the ILD layer 76, spacers 72, and remaining portions of the HKMG gate layers 66 and 64 inlaid between respective spacers 72.

An ILD layer 78 may be deposited over the ILD layer 76, as illustrated in FIG. 1A. In some embodiments, the insulating materials to form the ILD layer 76 and the ILD layer 78 may comprise silicon oxide, phosphosilicate glass (PSG), borosilicate glass (BSG), boron-doped phosphosilicate glass (BPSG), undoped silicate glass (USG), a porous or dense low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the ILD layer 76 and the ILD layer 78 may be deposited using any suitable method, such as CVD, physical vapor deposition (PVD), ALD, PEALD, PECVD, SACVD, FCVD, spin-on, and/or the like, or a combination thereof.

As illustrated in FIG. 1A, electrodes of electronic devices formed in the substrate 50 may be electrically connected to conductive features of an interconnect level 102 using conductive connectors (e.g., contacts 74) formed through the intervening dielectric layers. In the example illustrated in FIG. 1A, the contacts 74 make electrical connections to the source and drain regions 54 of FinFET 60. Contacts 74 to gate electrodes are typically formed over STI regions 62. A separate gate electrode 64 (shown in the left in FIG. 1A) illustrates such contacts. The contacts may be formed using photolithography techniques. For example, a patterned mask may be formed over the ILD layer 78 and used to etch openings that extend through the ILD layer 78 to expose a portion of gate electrodes over STI regions 62, as well as etch openings over the fins 58 that extend further, through the ILD layer 76 and the CESL (not shown) liner below the ILD layer 76 to expose portions of the source and drain regions 54. In some embodiments, an anisotropic dry etch process may be used wherein the etching is performed in two successive steps. The etchants used in the first step of the etch process have a higher etch rate for the materials of the ILD layers 76 and 78 relative to the etch rate for the materials used in the gate electrodes 64 and the CESL, which may be lining the top surface of the heavily-doped regions of the source and drain regions 54. Once the first step of the etch process exposes the CESL, the second step of the etch process may be performed wherein the etchants may be switched to selectively remove the CESL.

In some embodiments, a conductive liner may be formed in the openings in the ILD layer 76 and the ILD layer 78. Subsequently, the openings are filled with a conductive fill material. The liner comprises barrier metals used to reduce out-diffusion of conductive materials from the contacts 74 into the surrounding dielectric materials. In some embodiments, the liner may comprise two barrier metal layers. The first barrier metal layer comes in contact with the semiconductor material in the source and drain regions 54 and may be subsequently chemically reacted with the heavily-doped semiconductor in the source and drain regions 54 to form a low resistance ohmic contact, after which the unreacted metal may be removed. For example, if the heavily-doped semiconductor in the source and drain regions 54 is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of the conductive materials from over the surface of the ILD layer 78. The resulting conductive plugs extend into the ILD layers 76 and 78 and constitute contacts 74 making physical and electrical connections to the electrodes of electronic devices, such as the tri-gate FinFET 60 illustrated in FIG. 1A. In this example, contacts to electrodes over STI regions 62 and to electrodes over fins 58 are formed simultaneously using the same processing steps. However, in other embodiments these two types of contacts may be formed separately.

In some embodiments, conductive plugs 75 are formed through the ILD layers 76 and 78 to a top surface of the STI regions 62 or the substrate 50. The conductive plugs 75 form bottom portions of seal rings 80, which may comprise interconnected metal components on each subsequently formed layer of the semiconductor structure 100. The seal rings 80 may be stress protection structures formed around integrated circuits and may protect the internal circuitry of semiconductor chips such as, e.g., circuitry comprising the FinFETs 60, from moisture or from damage caused by processes such as, e.g., singulation of the semiconductor chips from wafers. The conductive plugs 75 may be formed using similar methods and materials as described above for the contacts 74. However, any suitable methods and materials may be used to form the conductive plugs 75.

FIG. 1B illustrates a detailed perspective view of region 101 of FIG. 1A, showing a top portion of an interconnect level 102. As illustrated by FIGS. 1A and 1B in accordance with some embodiments, the interconnect level 102 is formed, stacked vertically above the contacts 74 formed in the ILD layers 76 and 78, in accordance with a back end of line (BEOL) scheme adopted for the integrated circuit design. In the BEOL scheme illustrated in FIG. 1A, various interconnect levels have similar features. However, it is understood that other embodiments may utilize alternate integration schemes wherein the various interconnect levels may use different features. For example, the contacts 74, which are shown as vertical connectors, may be extended to form conductive lines which transport current laterally, and the conductive plugs 75 may also be extended to form conductive lines as parts of seal rings 80.

Interconnect levels (e.g., interconnect level 102) comprise conductive vias and lines embedded in an intermetal dielectric (IMD) layer. In addition to providing insulation between various conductive elements, an IMD layer may include one or more dielectric etch stop layers to control the etching processes that form openings in the IMD layer. Generally, vias conduct current vertically and are used to electrically connect two conductive features located at vertically adjacent levels, whereas lines conduct current laterally and are used to distribute electrical signals and power within one level. In embodiments illustrated in accordance with FIGS. 1A and 1B, conductive lines 105 connect contacts 74 to subsequently formed conductive vias and, at subsequent levels, vias connect lines on a level below the vias to lines above the vias (e.g., a pair of lines can be connected by a via). Other embodiments may adopt a different scheme. For example, conductive vias may be in the interconnect level 102 between the contacts 74 and the conductive lines 105.

Still referring to FIGS. 1A and 1B, the interconnect level 102 may be formed using, for example, a damascene process flow. First, a dielectric stack used to form IMD layer no may be deposited using one or more layers of the dielectric materials listed in the description of ILD layers 76 and 78. In some embodiments, IMD layer no includes an etch stop layer (not shown) positioned at the bottom of the dielectric stack. The etch stop layer comprises one or more insulator layers (e.g., SiOx, SiOC, SiCN, SiOxNy, SiN, CN, AlOx, AlN, AlYOx, ZrOx, YOx, combinations thereof, or the like) having an etch rate different than an etch rate of an overlying material. The techniques used to deposit the dielectric stack for IMD may be the same as those used in forming the ILD layers 76 and 78.

Appropriate photolithography and etching techniques (e.g., anisotropic RIE employing fluorocarbon chemicals) may be used to pattern the IMD layer 110 to form openings for lines. The openings for lines may be longitudinal trenches formed in the IMD layer 110. The etching techniques may utilize multiple steps. For example, a first main etch step may remove a portion of the dielectric material of IMD layer 110 and stop on an etch stop dielectric layer. Then, the etchants may be switched to remove the etch stop layer dielectric materials. The parameters of the various etch steps (e.g., chemical composition, flow rate, and pressure of the gases, reactor power, etc.) may be tuned to produce tapered sidewall profiles with a desired interior taper angle.

Several conductive materials may be deposited to fill the trenches forming the conductive lines 105 of the interconnect level 102. The openings may be first lined with one or more liners and then filled with a conductive fill layer 104, which may be covered by a capping layer.

A conductive diffusion barrier liner may be formed over sidewalls and bottom surfaces of the trenches. The conductive diffusion barrier liner may comprise one or more layers of TaN, Ta, TiN, Ti, Co, or the like, or combinations thereof, such as an outer liner 108 and a lower inner liner 106A. The conductive diffusion barrier liner may be deposited by any suitable method, for example, CVD, PECVD, PVD, ALD, PEALD, electrochemical plating (ECP), electroless plating and the like. In some embodiments, the outer liner 108 comprises TaN and the lower inner liner 106A comprises Co.

Next, a conductive fill layer 104 is formed over the conductive diffusion barrier liner to fill the trenches forming the conductive lines 105. The conductive fill layer 104 may comprise metals such as W, Cu, Co, Ru, CuMn, Mo, Al, or the like, or combinations thereof, or multi-layers thereof. In some embodiments, the conductive fill layer 104 is copper. The conductive materials used in forming the conductive fill layer 104 may be deposited by any suitable method, for example, CVD, PECVD, PVD, ALD, PEALD, electrochemical plating (ECP), electroless plating and the like. In some embodiments, a thin conductive seed layer may be deposited over the conductive diffusion barrier liner to help initiate an ECP deposition step that completely fills the openings with a conductive fill material. The conductive seed layer may be of the same conductive material as the conductive fill layer and deposited using a suitable deposition technique (e.g., CVD, PECVD, ALD, PEALD, or PVD, or the like).

After the conductive fill layer 104 is formed, a capping layer 106B may be formed over the conductive fill layer 104. After depositing the material for the capping layer 106B, excess portions may be removed with any suitable method, such as using lithography. As such, a photoresist (not specifically illustrated) may be formed over the material of the capping layer 106B and patterned to expose portions of the material of the capping layer 106B that are not directly over the conductive fill layer 104 and the lower inner liner 106A. The exposed portions may then be removed by etching or any suitable method. In some embodiments, the capping layer 106B is formed using a selective deposition process, such as e.g. an ALD process, that deposits the capping layer 106B on the metallic surfaces of the conductive fill layer 104, the outer liner 108 and the lower inner liner 106A but does not significantly deposit on the dielectric surfaces of the IMD layer 110. In some embodiments, the capping layer 106B is the same material as the lower inner liner 106A, and the lower inner liner 106A and the capping layer 106B together form an inner liner 106 of the same material, such as e.g. Co.

Conductive lines 107 may be formed over the conductive plugs 75 as parts of seal rings 80. The conductive lines 107 may be formed using similar materials and methods as the conductive lines 105. In some embodiments, the conductive lines 107 are formed with larger widths than the conductive lines 105.

Any excess conductive material over the IMD layer 110 and/or on top surfaces of the outer liner 108 outside of the openings may be removed by a planarizing process (e.g., CMP) thereby forming a top surface comprising dielectric regions of IMD layer 110 that are substantially coplanar with conductive regions of lines 105. The planarization step completes fabrication of the interconnect level 102 comprising conductive lines 105 and 107 embedded in IMD layer 110, as illustrated in FIGS. 1A and 1B.

FIG. 1B further illustrates reference cross-sections that are used in later figures. Cross-section A-A' is along a longitudinal axis of the conductive line 105 and cross-section B-B' is perpendicular to cross-section A-A'.

FIGS. 2A through 10B are cross-sectional and perspective views of intermediate stages in the manufacturing of interconnect structures, in accordance with some embodiments. FIGS. 2A, 3A, 4A, 4C, 5A, 6B, 7A, and 8A are illustrated along the cross-section A-A' illustrated in FIG. 1B. FIGS. 2B, 3B, 4B, 4D, 5B, 6A, 6C, 6D, 7B, 7C, 8B, 9A, 9B, 10A, and 10B are illustrated along the cross-section B-B' illustrated in FIG. 1B.

Figure 2B:
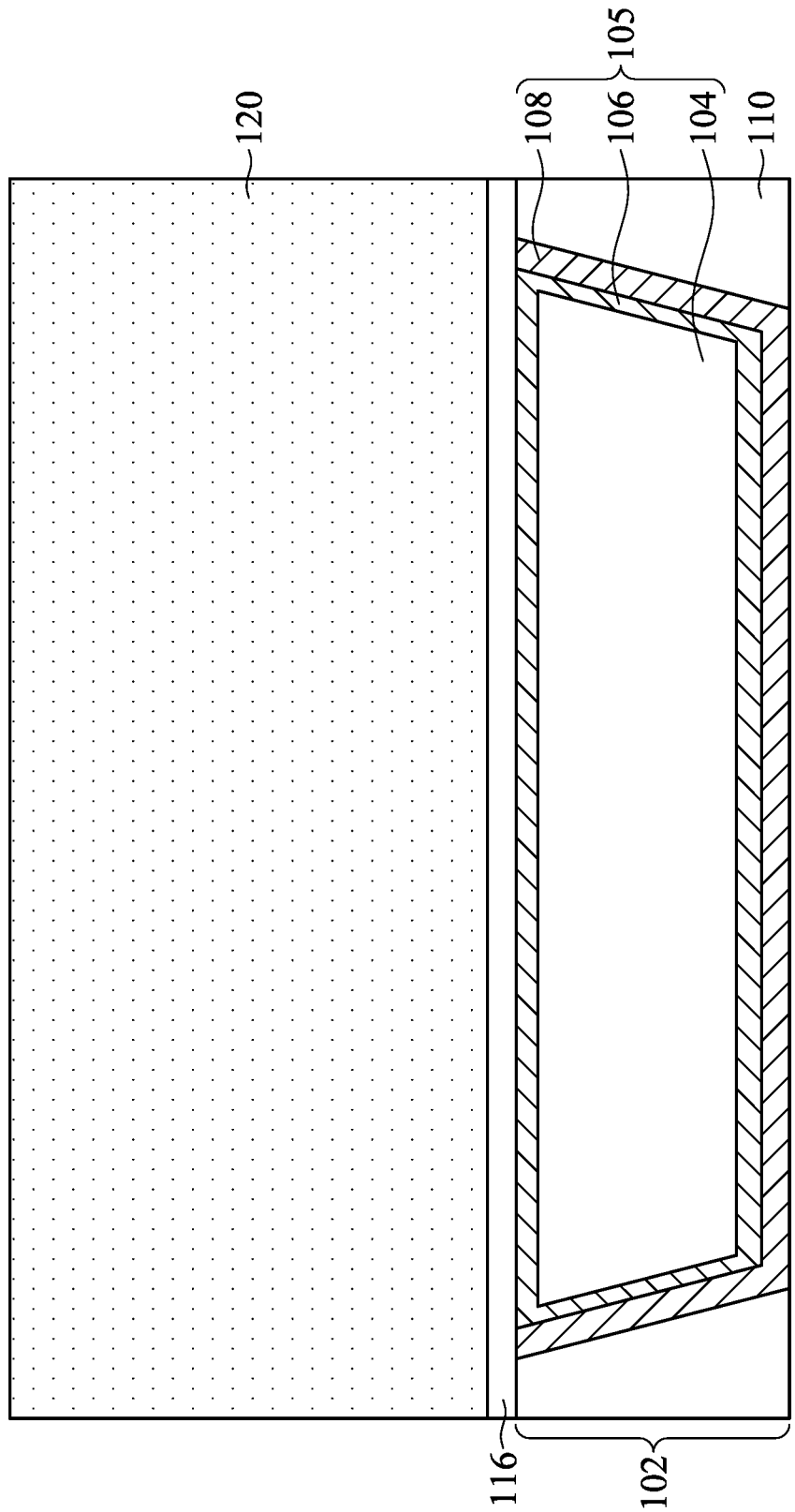
FIGS. 2A through 10B illustrate cross-sectional views of interconnect structures at intermediate stages of manufacturing, in accordance with some embodiments.

FIGS. 2A and 2B illustrate the formation of a dielectric stack comprising an etch stop layer (ESL) 116 and a dielectric layer 120 over the interconnect level 102. The dielectric stack can be used for the subsequent formation of conductive vias and conductive lines in an interconnect level 140 (see below, FIGS. 8A and 8B) formed on the interconnect level 102. The ESL 116 is formed on the interconnect level 102. The ESL 116 can be used for controlling subsequent etching processes to form an opening for a via (see below, FIGS. 3A and 3B). The ESL 116 comprises one or more insulator layers such as, e.g., SiN, SiC, AlOx, MN, AlYOx, ZrOx, YOx, combinations thereof, or the like, having an etch rate different than an etch rate of the underlying IMD 110 and the subsequently formed overlying material. The ESL 116 may be formed using PECVD, ALD, CVD, or the like.

Next, the dielectric layer 120 is formed on the ESL 116. The dielectric layer 120 comprises one or more insulator layers such as, e.g., e.g., SiOx, SiOC, SiCN, SiOxNy, SiN, or the like. In accordance with some embodiments, the dielectric layer 120 is formed using PECVD, FCVD, spin-on coating, or the like.

Figure 3A:
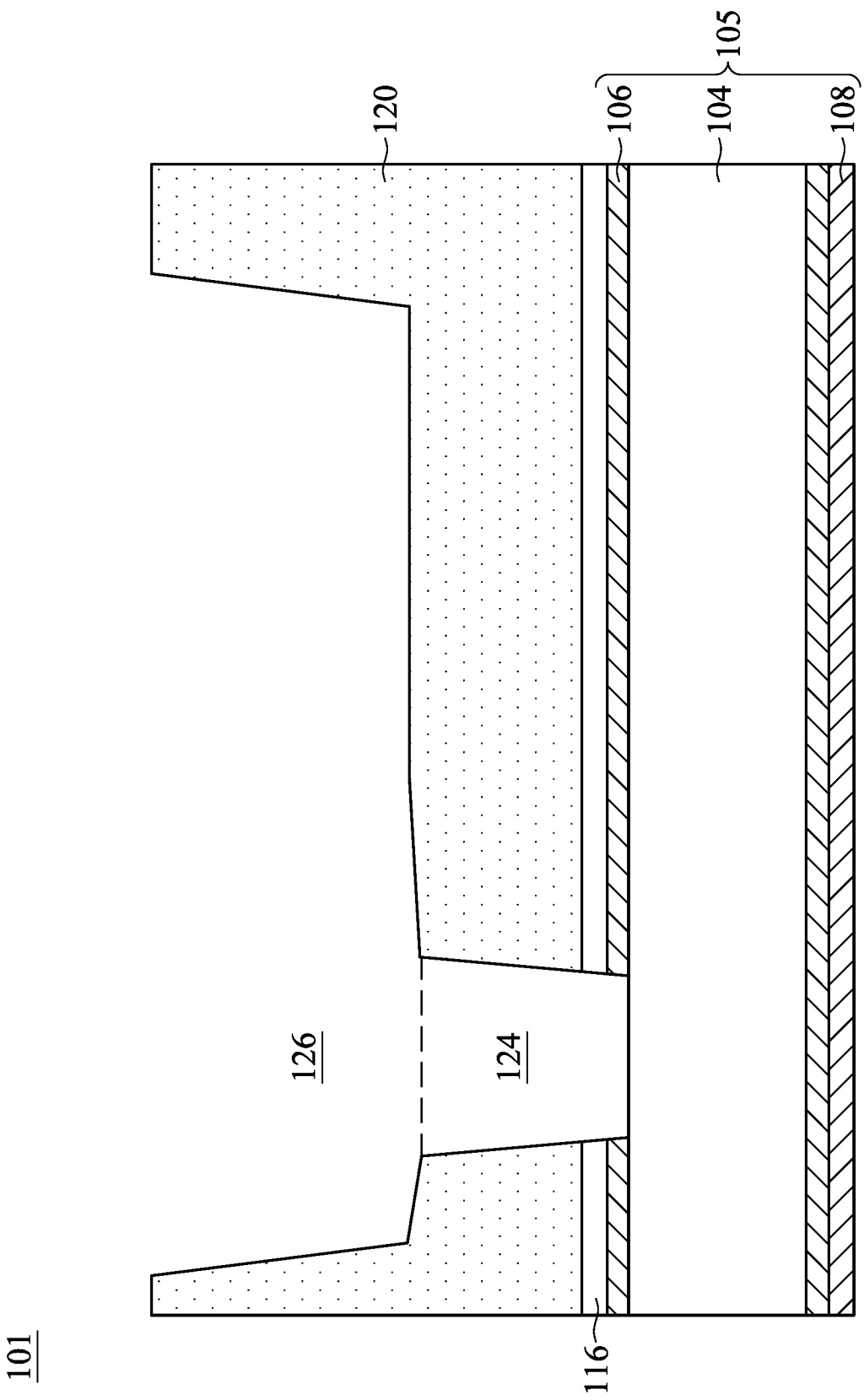
Figure 3B:
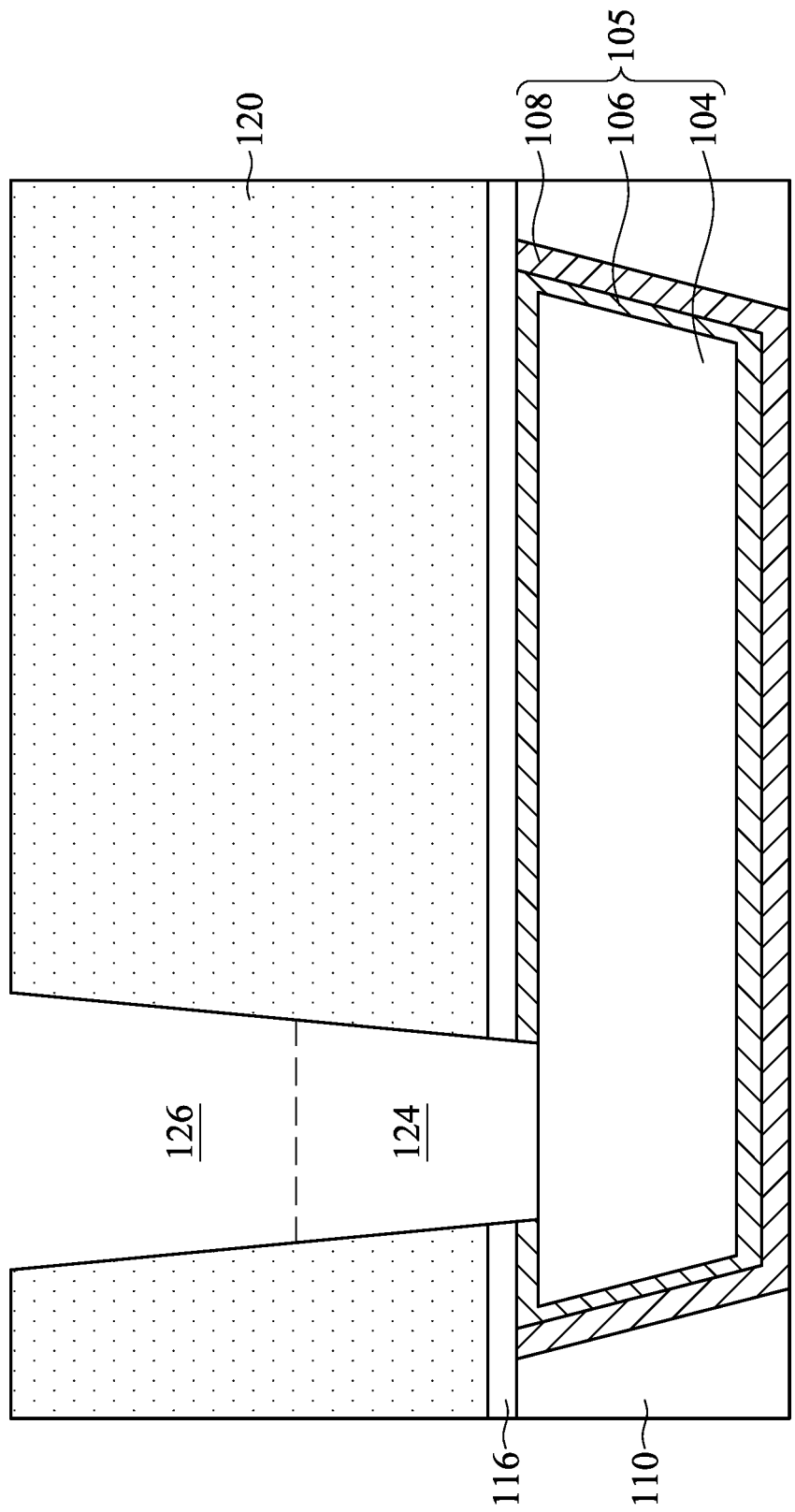

In FIGS. 3A and 3B, openings 124 for vias and openings 126 for lines are formed in the dielectric layer 120 with appropriate photolithography and etching techniques (e.g., anisotropic RIE employing fluorocarbon chemicals). The openings 124 for vias may be vertical holes extending through the dielectric layer 120 and the ESL 116 to expose a top conductive surface of the conductive lines 105, and the openings 126 for lines may be longitudinal trenches formed in an upper portion of the dielectric layer 120. In some embodiments, the method used to pattern holes and trenches in the dielectric layer 120 utilizes a via-first scheme, wherein a first photolithography and etch process form holes for vias, and a second photolithography and etch process form trenches for lines. Other embodiments may use a different method, for example, a trench-first scheme, or an incomplete via-first scheme, or a buried etch stop layer scheme. The etching techniques may utilize multiple steps. For example, a first main etch step may remove a portion of the dielectric material of the dielectric layer 120 and stop on the ESL 116. Then, the etchants may be switched to remove the dielectric materials of the ESL 116. The parameters of the various etch steps (e.g., chemical composition, flow rate, and pressure of the gases, reactor power, etc.) may be tuned to produce tapered sidewall profiles with a desired interior taper angle. In some embodiments in which the conductive lines 105 comprise a top portion of an inner layer 106 covering a top surface of a conductive fill layer 104, the openings 124 may extend through the top portion of the inner layer 106 to expose a top surface of the conductive fill layer 104.

Figure 4A:
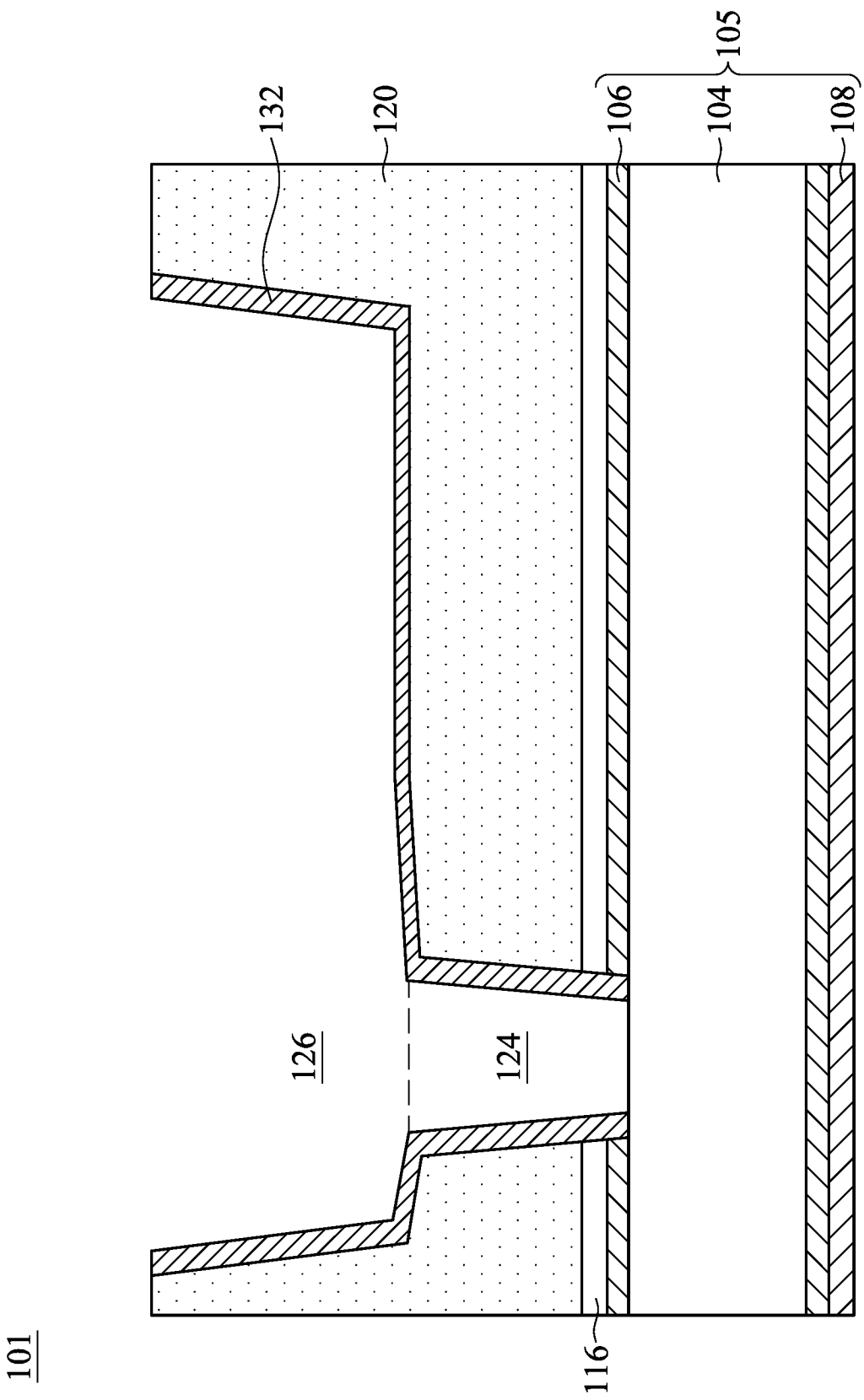
Figure 4B:
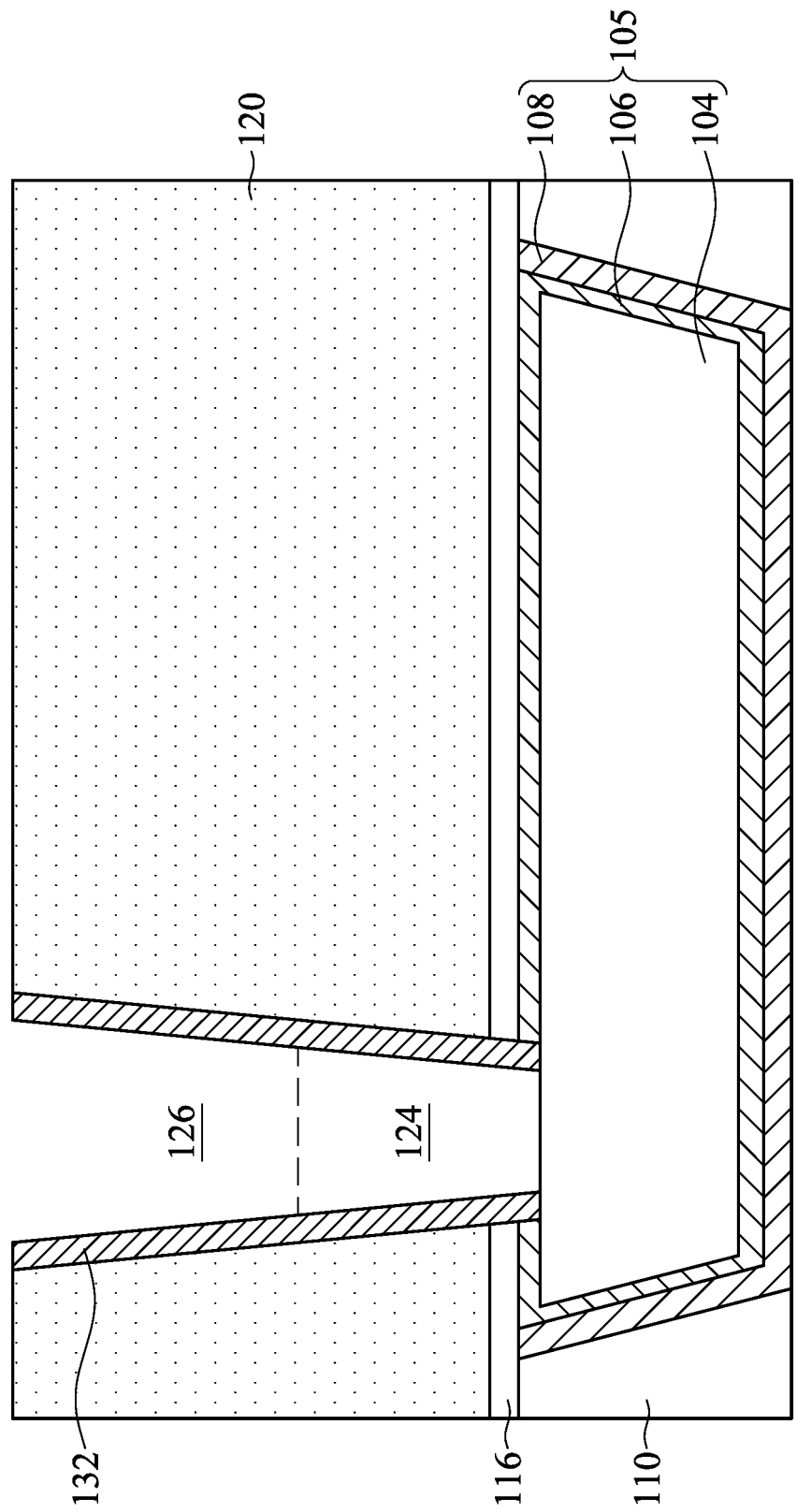

In FIGS. 4A and 4B, a selective deposition of a barrier layer 132 is performed on sidewalls of the opening 124 and on sidewalls and bottom surfaces of the opening 126. The barrier layer 132 may reduce diffusion of atoms from subsequently deposited conductive material (see below, FIGS. 6A and 6B) into the dielectric layer 120. In some embodiments, the selective deposition of the barrier layer 132 reduces the amount of barrier material deposited on a bottom surface of the opening 124, so that little or no barrier layer 132 is formed on the conductive fill layer 104. This may reduce resistance between the conductive fill layer 104 and the subsequently deposited outer liner 134 (see below, FIGS. 6A and 6B).

As an example of the selective deposition of the barrier layer 132, a sacrificial layer (not illustrated) may be formed on the exposed portion of the conductive fill layer 104 to block, prevent, or otherwise inhibit the subsequent formation of the barrier layer 132 on the conductive fill layer 104. The sacrificial layer may be deposited such that little or no material of the sacrificial layer is formed on the ESL 116 or the dielectric layer 120. The sacrificial layer comprises a material that adheres or bonds to the conductive fill layer 104 and does not adhere or bond to the dielectric layer 120 and/or to the ESL 116. For example, the material may form chelation bonds with metal (e.g., copper) of the conductive fill layer 104 but not form bonds with the dielectric layer 120 or the ESL 116. In some embodiments, the sacrificial layer comprises organic molecules such as e.g. benzotriazole (BTA), which has the chemical formula $C_6H_4N_3H$. BTA molecules have a first side with three nitrogen atoms that can bond to a metal such as copper and a second side which has a hydrophobic benzo ring to which some precursors of the barrier layer 132 are unable to bond. The first side of the BTA molecule can bond to the conductive fill layer 104 while the second side protrudes and blocks precursors from bonding to the conductive fill layer 104. In this manner, a sacrificial layer comprising a monolayer of BTA or multiple monolayers of BTA can prevent the barrier layer 132 from forming on the conductive fill layer 104 or on the sacrificial layer.

After forming the sacrificial layer, the barrier layer 132 is formed on sidewalls of the opening 124 and on sidewalls and bottom surfaces of the opening 126. The barrier layer 132 may comprise a barrier material such as tantalum, tantalum nitride, titanium, titanium nitride, the like, or a combination thereof. The barrier layer 132 may be formed using a suitable process, such as an ALD process and/or a CVD process. The barrier layer 132 is formed over exposed surfaces of the dielectric layer 120 and the ESL 116, but is blocked from forming on the conductive fill layer 104 within the opening 124 by the sacrificial layer. Additionally, the barrier layer 132 does not significantly form on exposed surfaces of the sacrificial layer, as described previously. After the barrier layer 132 is formed, the sacrificial layer may be removed by a suitable process such as a thermal treatment or a plasma treatment such as an in-situ $H_2$ or Ar plasma treatment. Excess portions of the barrier layer 132 over the dielectric layer 120 may be removed with a planarization such as e.g. a CMP.

In some embodiments, the barrier layer 132 is formed to a thickness of 8 Å to 20 Å on sidewalls of the opening 124 and on sidewalls and bottom surfaces of the opening 126, which may be advantageous by reducing diffusion of atoms from subsequently deposited conductive material (see below, FIGS. 6A and 6B) into the dielectric layer 120. Forming the barrier layer 132 to a thickness less than 8 Å may be disadvantageous by allowing undesirable diffusion of atoms from subsequently deposited conductive material into the dielectric layer 120. Forming the barrier layer 132 to a thickness greater than 20 Å may be disadvantageous by also forming material of the barrier layer 132 on the bottom surface of the opening 124 to an undesirable thickness, which may increase device resistance.

Figure 4C:
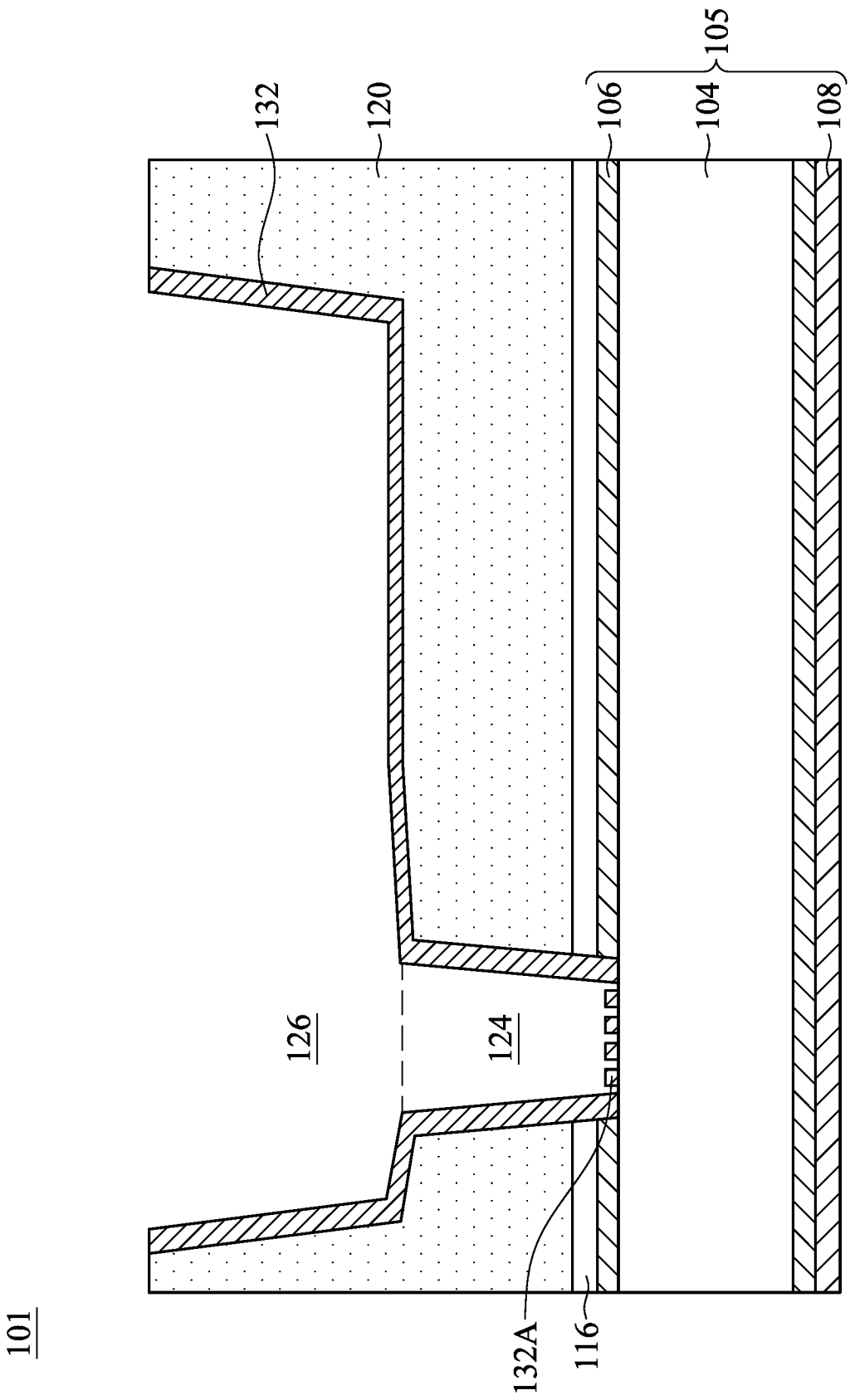
Figure 4D:
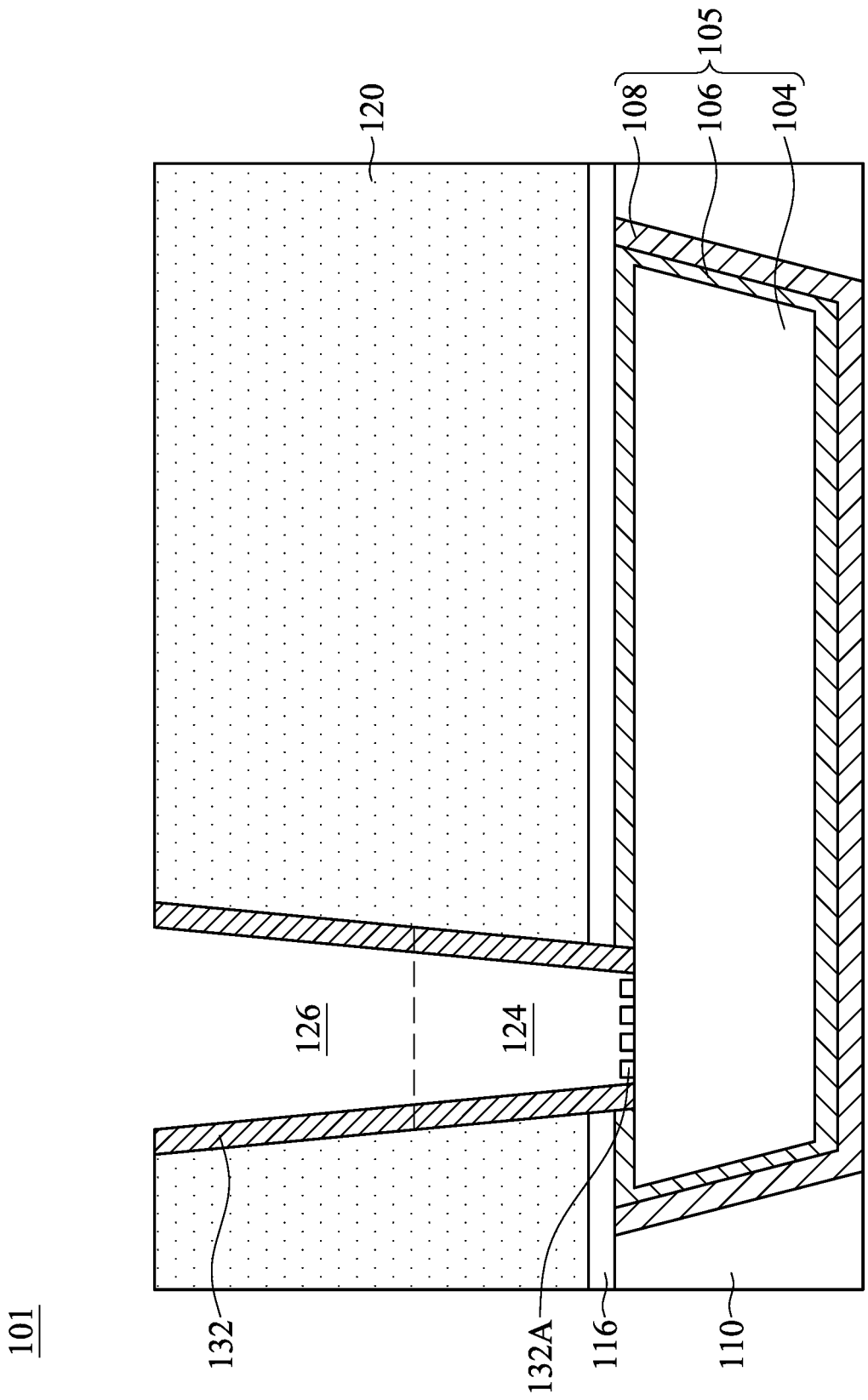

FIGS. 4C and 4D illustrate an embodiment in which a bottom barrier layer 132A is formed on the bottom surface of the opening 124. The bottom barrier layer 132A may be formed during the formation of the barrier layer 132 on the sidewalls of the opening 124 and on sidewalls and bottom surfaces of the opening 126. The bottom barrier layer 132A may be discontinuous and may cover a percentage of the bottom surface of the opening 124 in a range of 10% to 90%. The bottom barrier layer 132A may have a thickness in a range of 3 Å to 8 Å, which may be advantageous for reducing resistance between the conductive fill layer 104 and the subsequently deposited conductive material (see below, FIGS. 6A and 6B). The bottom barrier layer 132A being formed to a thickness greater than 8 Å may be disadvantageous because it may increase resistance between the conductive fill layer 104 and the subsequently deposited conductive material.

Figure 5A:
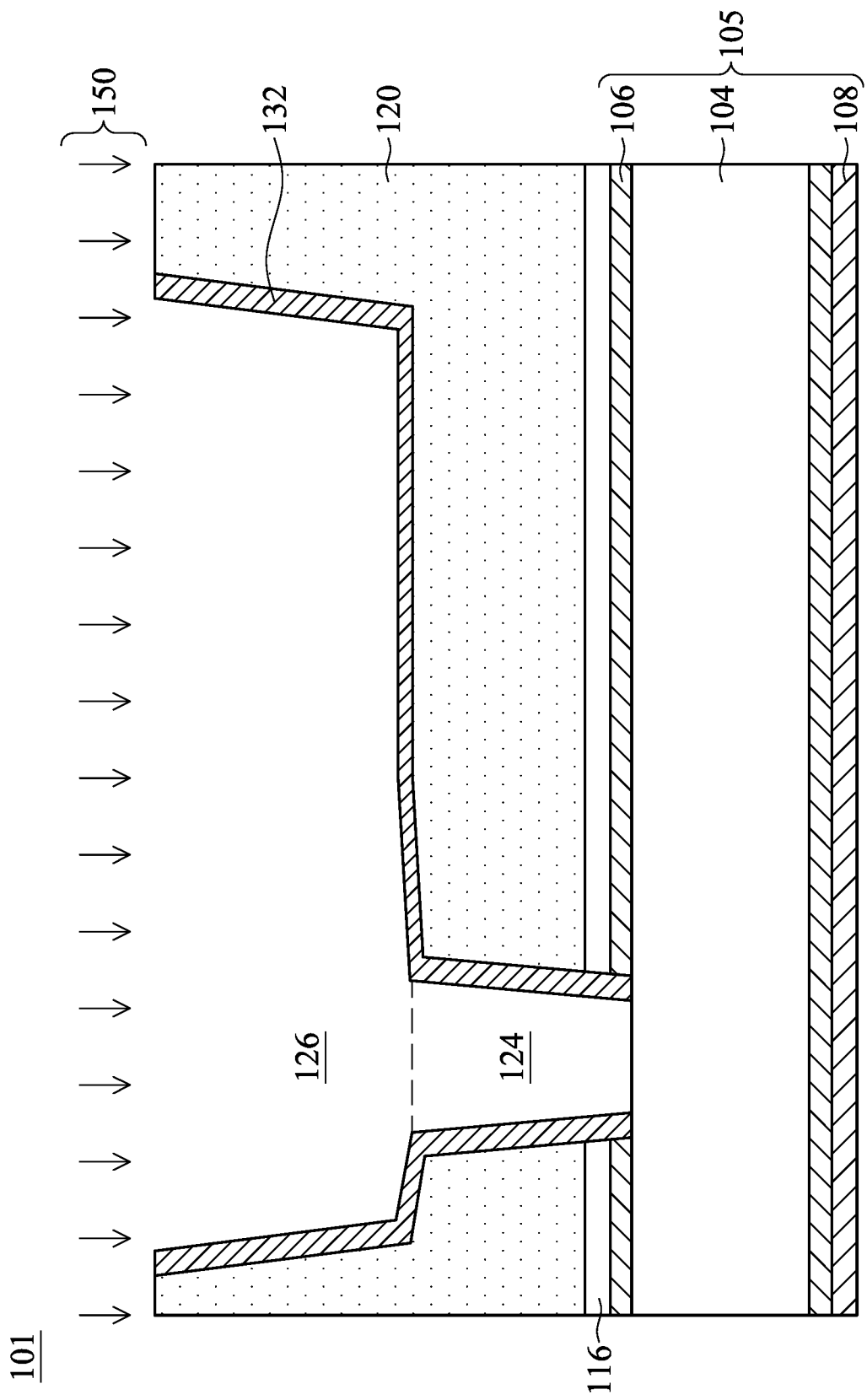
Figure 5B:
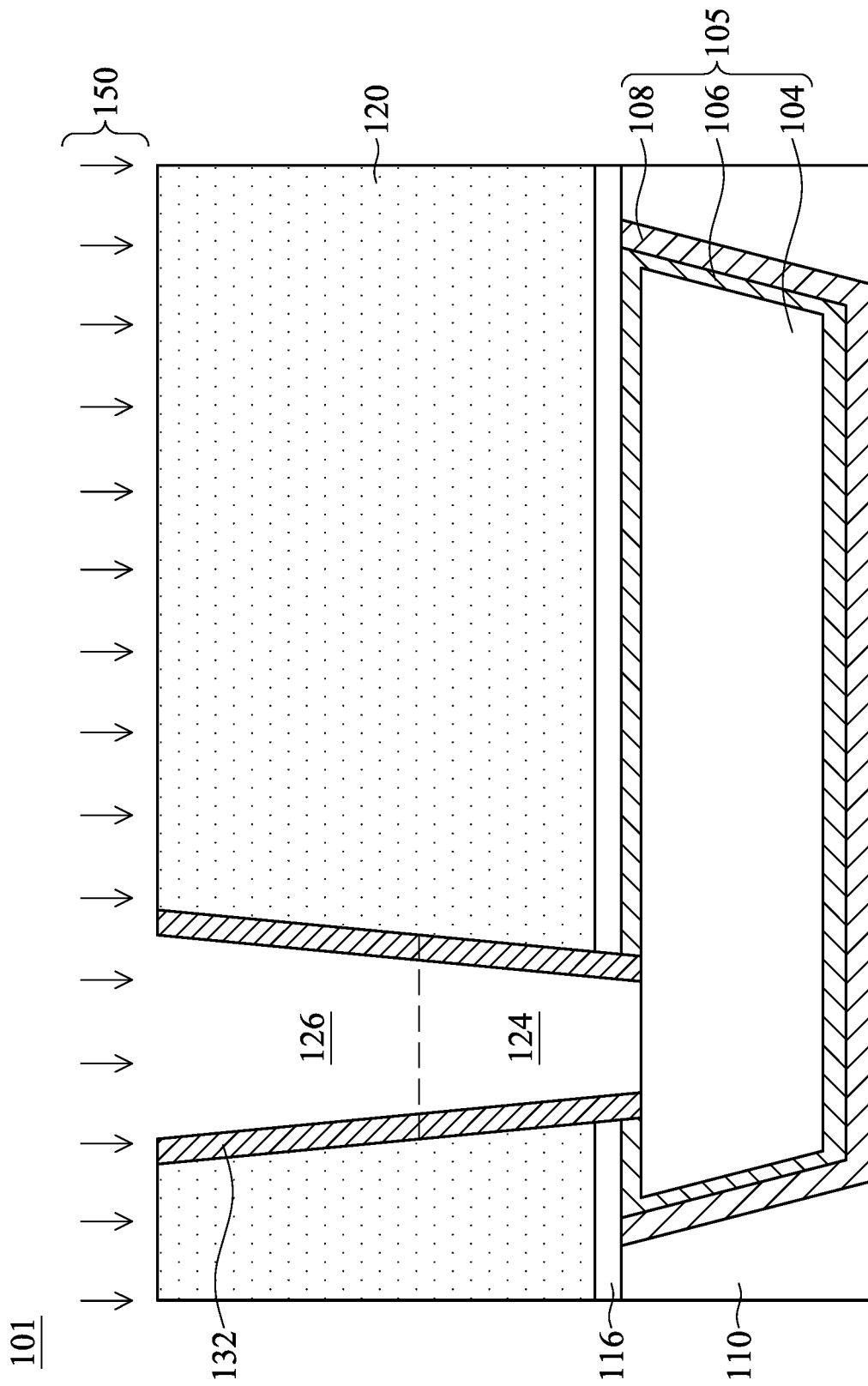

In FIGS. 5A and 5B, following from FIGS. 4A and 4B, respectively, a treatment process 150 is performed on the top surface of the conductive fill layer 104 exposed through the openings 124. The treatment process 150 may passivate the exposed underlying surface of the conductive fill layer 104, which may reduce corrosion of the top surface of the conductive fill layer 104 that can be induced by reactions, such as e.g. oxidation-reduction reactions, with a subsequently formed outer liner 134 (see below, FIGS. 6A and 6B). In some embodiments, the subsequently formed outer liner 134 comprises ruthenium (Ru), which has a higher reduction potential than Cu and Co. Because of this, the subsequently formed outer liner 134 comprising Ru physically contacting the conductive fill layer 104 comprising, e.g., Cu or Co may increase the probability of triggering oxidation-reduction reactions that may corrode the top surface of the conductive fill layer 104 and decrease device performance. The treatment process 150 may reduce the probability of corrosion of the top surface of the conductive fill layer 104 by passivating the conductive fill layer 104.

The treatment process 150 may be a cleaning treatment, such as e.g. a plasma or bombardment treatment, of the exposed surface of the conductive fill layer 104, which may be e.g. copper or cobalt. The treatment process 150 may decrease impurity levels, e.g. C, N, O, and F impurities, on the exposed surface of the conductive fill layer 104. In some embodiments, the treatment process is a plasma treatment using $H_2$, Ar, $N_2$, $NH_3$, $O_2$, the like, or combinations thereof. The plasma treatment may be performed at a power in a range of 100 W to 800 W as measured at the power supply, which can reduce impurities and subsequent corrosion of the top surface of the conductive fill layer 104. Performing the plasma treatment at less than 100 W may be disadvantageous by leading to insufficient removal of the impurities and increased corrosion of the top surface of the conductive fill layer 104. Performing the plasma treatment at more than 800 W may be disadvantageous by leading to damage of the top surface of the conductive fill layer 104. The plasma treatment may be performed for a duration in a range of 10 seconds to 2 minutes, which can reduce impurities and subsequent corrosion of the top surface of the conductive fill layer 104. Performing the plasma treatment for less than 10 seconds may be disadvantageous by leading to insufficient removal of the impurities and increased corrosion of the top surface of the conductive fill layer 104. Performing the plasma treatment for more than 2 minutes may be disadvantageous by leading to damage of the top surface of the conductive fill layer 104.

Figure 6A:
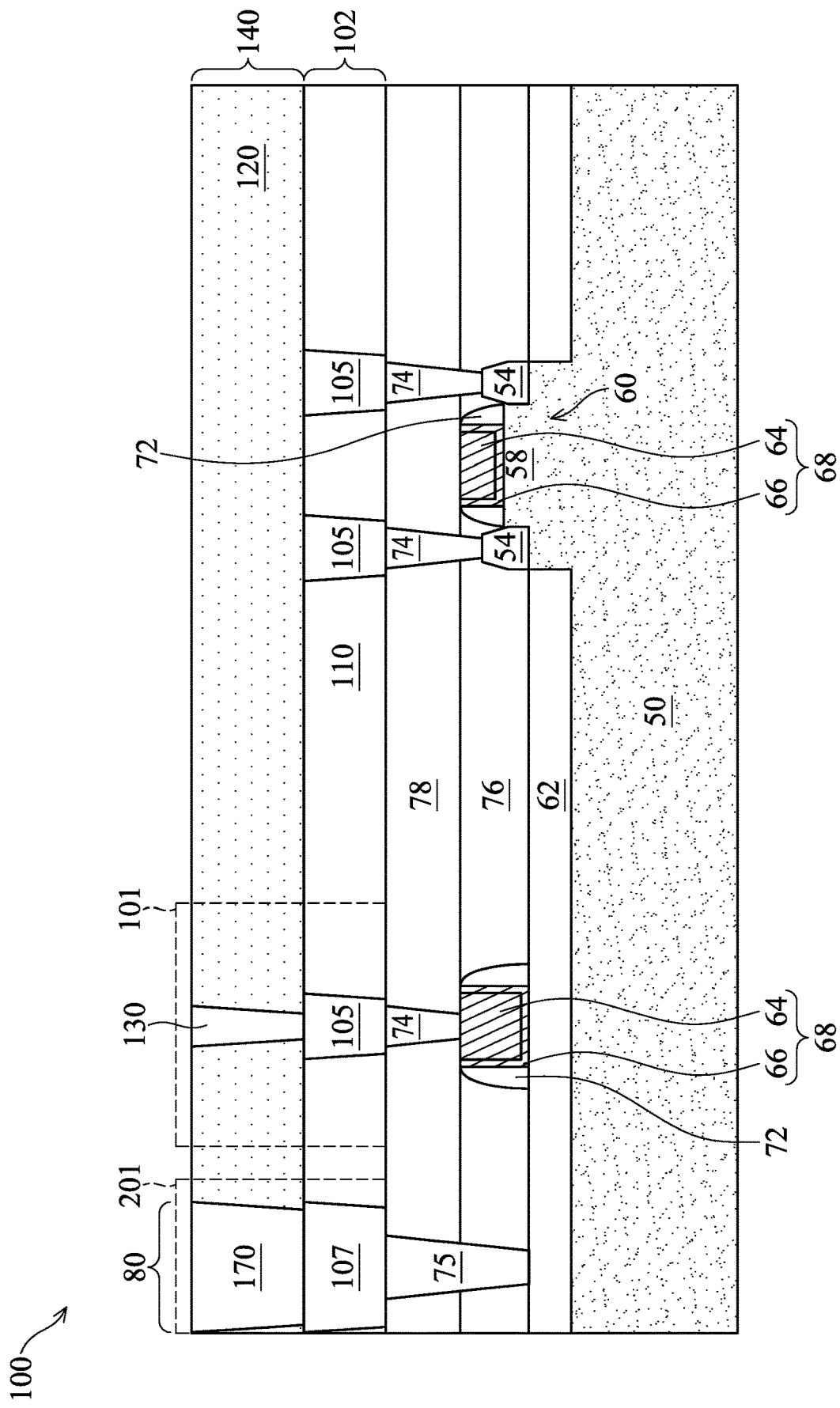
Figure 6B:
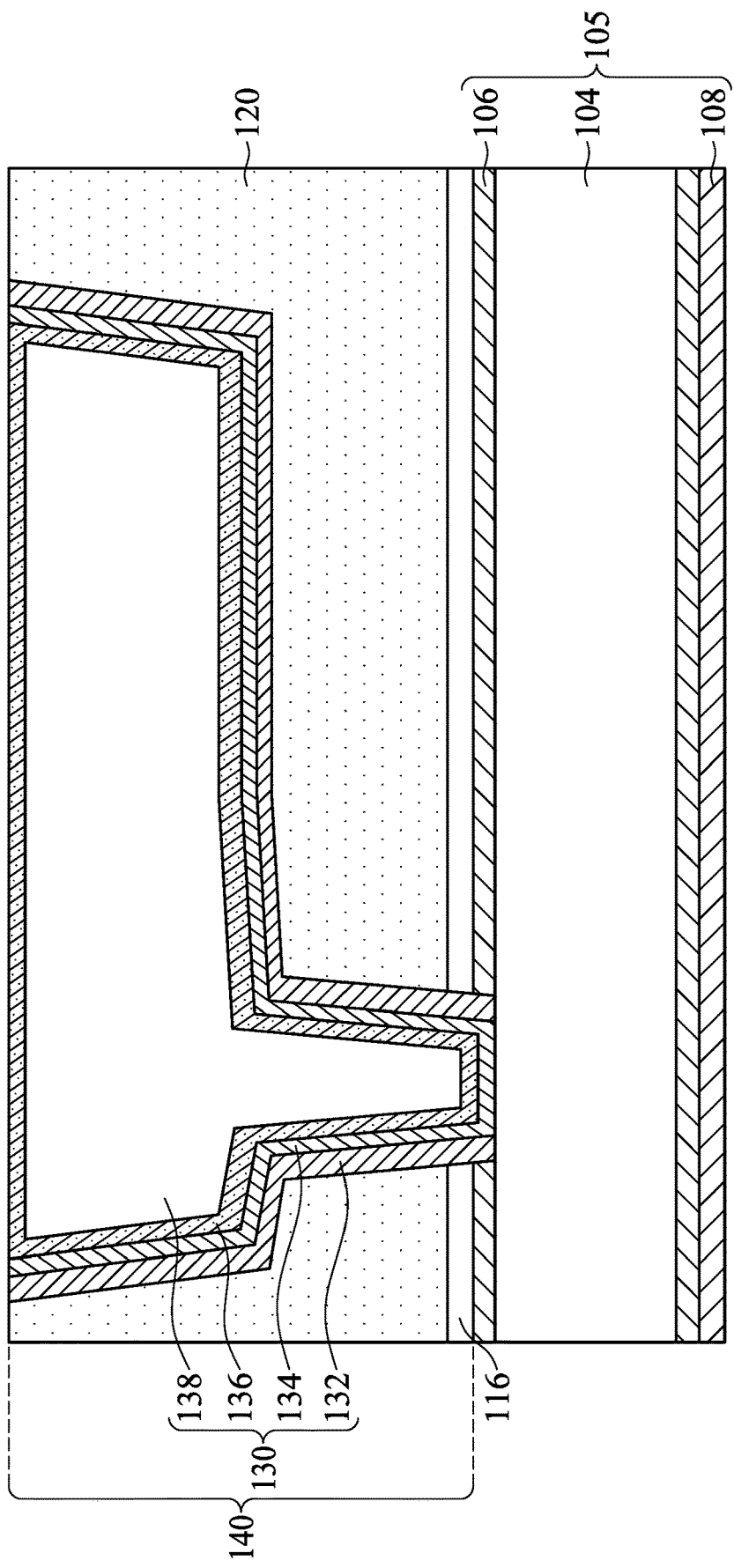
Figure 6C:
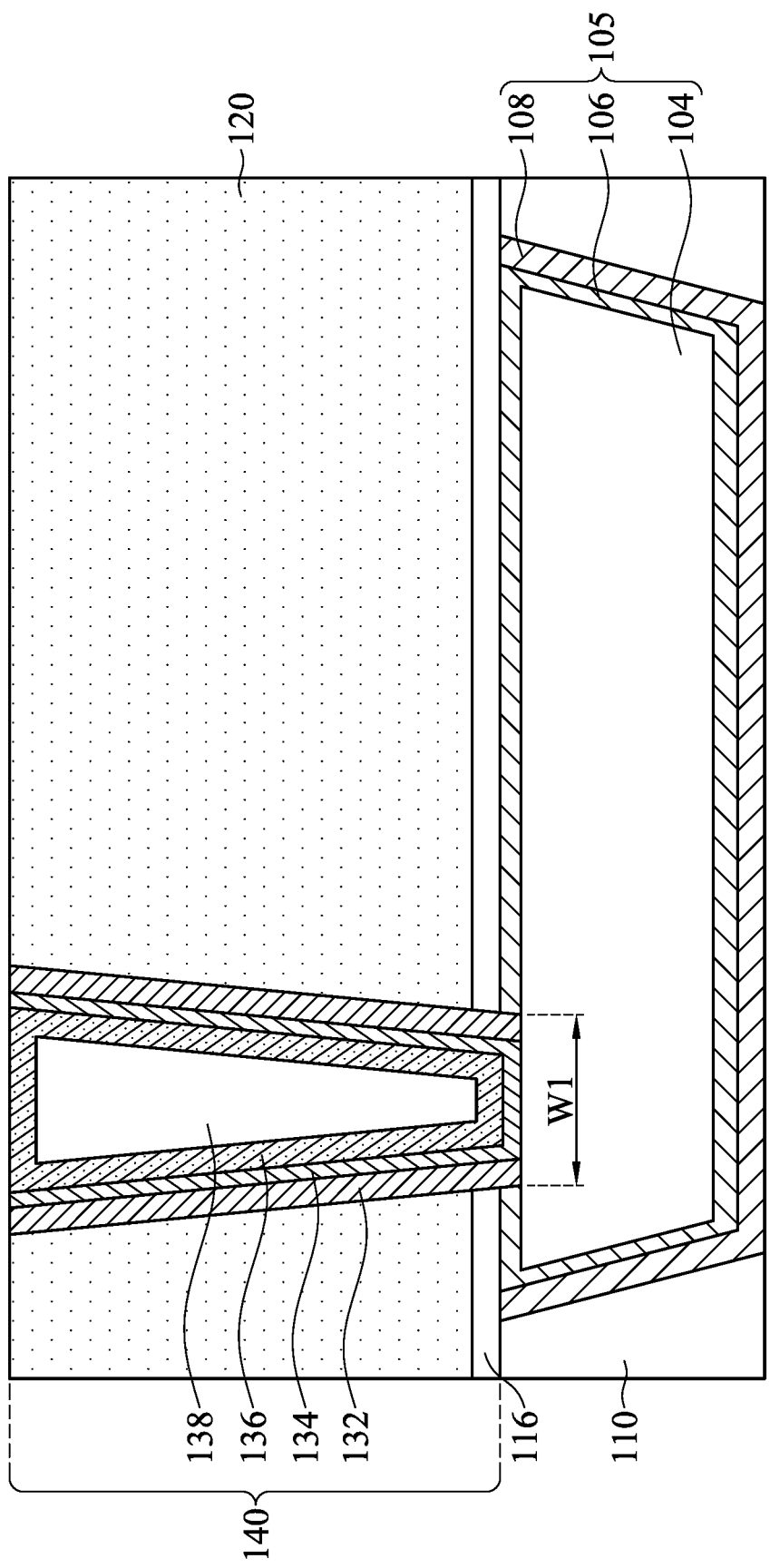
Figure 6D:
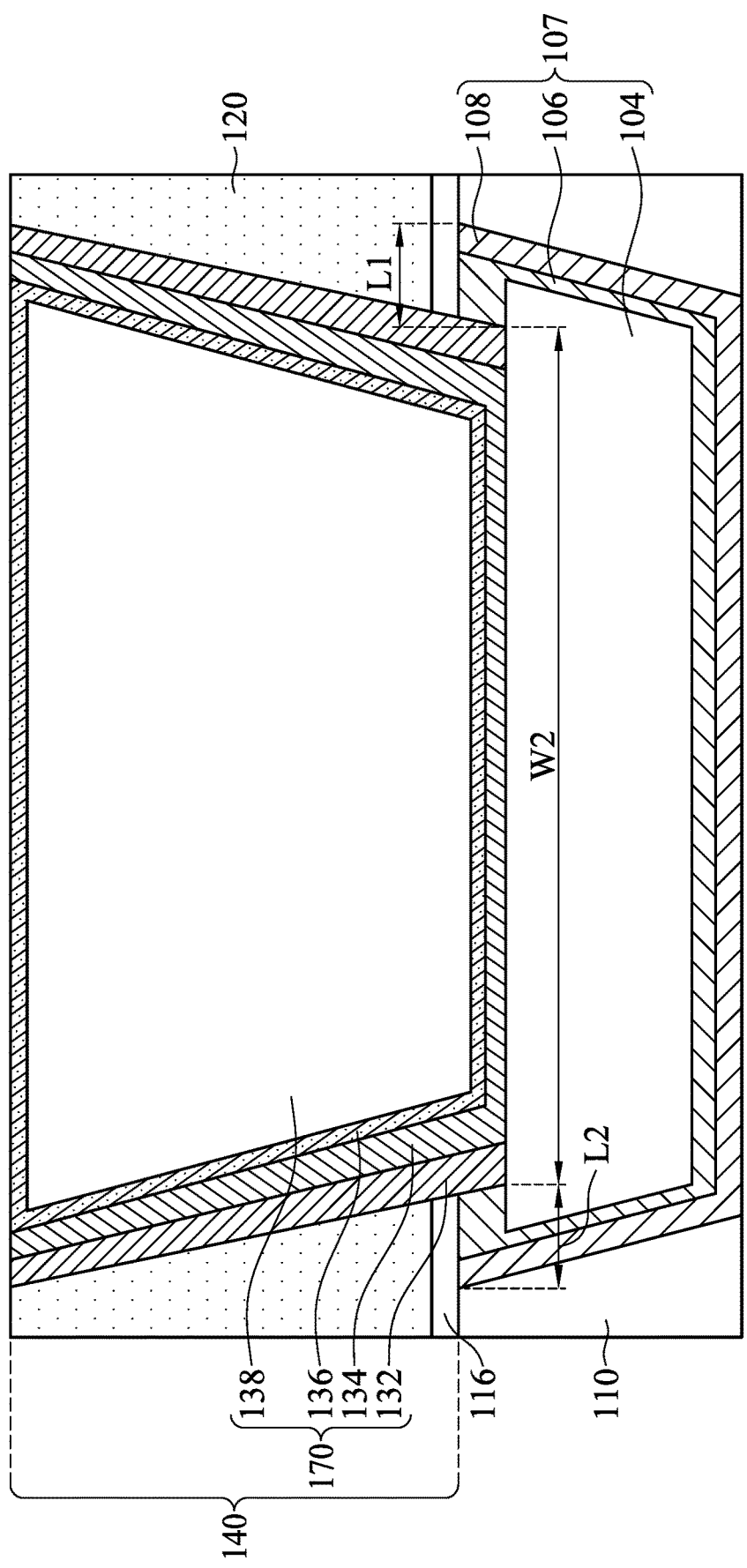

In FIGS. 6A through 6D, conductive features 130 and 170 are formed through the dielectric layer 120. FIG. 6A illustrates a cross-sectional view of the semiconductor structure 100 including the interconnect levels 102 and 140. FIGS. 6B and 6C illustrate cross-sectional views of region 101 as illustrated in FIG. 6A along cross-sections A-A' and B-B', respectively. FIG. 6D illustrates a cross-sectional view of region 201 as illustrated in FIG. 6A along cross-section B-B'. The conductive features 130 may comprise via portions filling the openings 124 and line portions filling the openings 126, and the conductive features 170 may be formed using similar methods and materials as the conductive features 130 but with wider dimensions than the conductive features 130. In some embodiments, the conductive features 130 and 170 include an outer liner 134, an inner liner 136, and a conductive fill material 138.

The outer liner 134 is formed over exposed surfaces of the barrier layer 132 and the conductive fill layer 104 in the openings 124 and 126. The outer liner 134 may be formed from ruthenium, molybdenum, rhodium, or the like, and may be formed by a deposition process such as CVD, PVD, ALD, the like, or a combination thereof. In accordance with some embodiments, the outer liner 134 may be formed with a CVD process by flowing a precursor molecule containing ruthenium (Ru) attached to one or more alkyl groups (e.g., hexadiene, pyridine, butadiene, and cycloheptadiene), one or more carbonyl groups, one or more other functional groups, or combinations thereof. For example, the outer liner 134 may be formed by CVD using tricarbonyl-hexadiene ruthenium as the precursor molecule. A benefit of forming the outer liner 134 with ruthenium is that the adhesion of copper to ruthenium is weaker than the adhesion of the barrier layer 132 (e.g., TaN) to copper, which may improve the filling process for the conductive fill layer 138 (e.g. copper), as copper is easier to flow on a ruthenium-based surface. Excess portions of the outer liner 134 over the dielectric layer 120 may be removed with a planarization such as e.g. a CMP.

In some embodiments, the outer liner 134 is formed to a thickness of 5 Å to 15 Å conformally on sidewalls and bottom surfaces of the opening 124 and on sidewalls and bottom surfaces of the opening 126, which may be advantageous by improving gap filling of subsequently deposited conductive material such as, e.g., the inner liner 136 and the conductive fill layer 138, to the barrier layer 132. Forming the outer liner 134 to a thickness less than 5 Å may be disadvantageous by leading to worse flowing movement of subsequently deposited conductive material to the barrier layer 132. Forming the outer liner 134 to a thickness greater than 15 Å may be disadvantageous by leading to increased corrosion of the underlying conductive fill layer 104, which may increase device resistance.

After forming the outer liner 134, an inner liner 136 and a conductive fill layer 138 may be formed to fill the openings 124 and 126. The inner liner 136 may improve the adhesion between the outer liner 134 and the conductive fill layer 138. The inner liner 136 and the conductive fill layer 138 may be formed using similar materials and methods as the inner liner 106 and the conductive fill layer 104, respectively, as described above in respect to FIGS. 1A and 1B. For example, a lower inner liner portion of the inner liner 136 may be formed first using similar methods and materials as the lower inner liner 106A (see above, FIG. 1B). The conductive fill layer 138 may be formed over the lower inner liner portion of the inner liner 136, and a capping portion of the inner liner 136 is then formed over the conductive fill layer 138 using similar methods and materials as the capping layer 106B (see above, FIG. 1B) so that the inner liner 136 covers a bottom surface, sidewalls, and a top surface of the conductive fill layer 138. In some embodiments, the inner liner 136 comprises cobalt and the conductive fill layer 138 comprises copper, and the cobalt of the inner liner 136 may improve subsequent adhesion of the copper of the conductive fill layer 138 to ruthenium of the outer liner 134.

In some embodiments, the inner liner 136 is formed to a thickness of 5 Å to 15 Å, which may improve adhesion between the outer liner 134 and the conductive fill layer 138. Forming the inner liner 136 to a thickness less than 5 Å may be disadvantageous by leading to worse adhesion between the outer liner 134 and the conductive fill layer 138. Forming the inner liner 136 to a thickness greater than 15 Å may be disadvantageous by increasing resistance between the outer liner 134 and the conductive fill layer 138.

FIG. 6D illustrates conductive features 170 that may be formed over the conductive lines 107 as parts of seal rings 80 (see above, FIG. 1A). The conductive features 170 may be formed using similar materials and methods as the conductive features 130. In some embodiments, the conductive features 170 are formed with larger widths than the conductive features 130. For example, the conductive features 130 may have widths W1 measured across bottom surfaces of the conductive features 130 in a range of 10 nm to 22 nm, and the conductive features 170 may have widths W2 measured across bottom surfaces of the conductive features 170 in a range of 100 nm to 180 nm. The bottom surface of the conductive features 170 may be separated from an outer edge of the top surface of the conductive lines 107 by a greatest separation length L1 and a smallest separation length L2, wherein the difference between the greatest separation length L1 and the smallest separation length L2 is in a range of 0.5 nm to 5 nm.

Any excess conductive material over the dielectric layer 120 and/or on top surfaces of the outer liner 134 outside of the openings 124 and 126 may be removed by a planarizing process (e.g., CMP) thereby forming a top surface comprising dielectric regions of the dielectric layer 120 that are substantially coplanar with conductive regions of the conductive features 130. The planarization step completes fabrication of an interconnect level 140 comprising conductive features 130 and/or 170 embedded in dielectric layer 120.

Figure 7A:
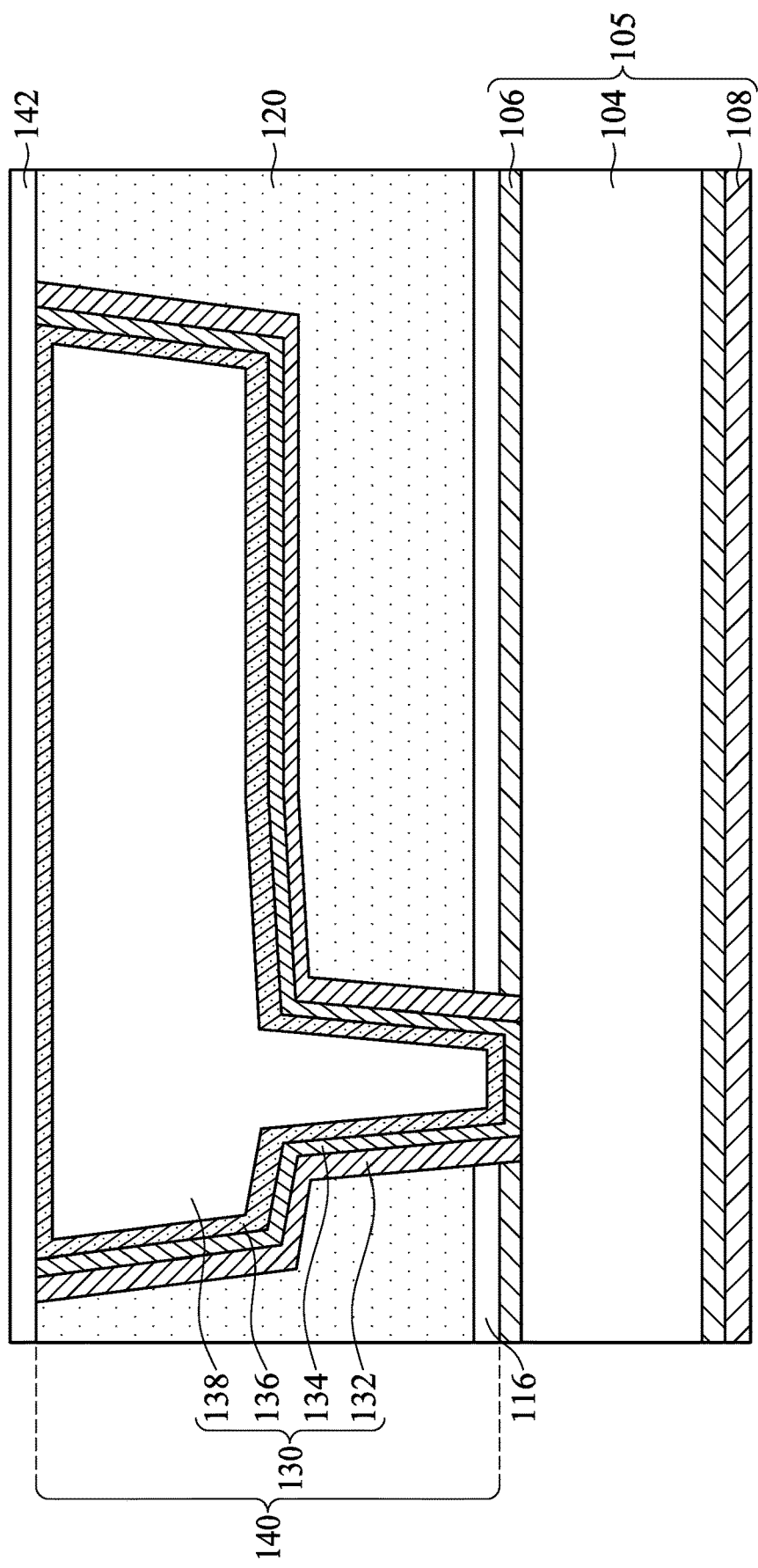
Figure 7B:
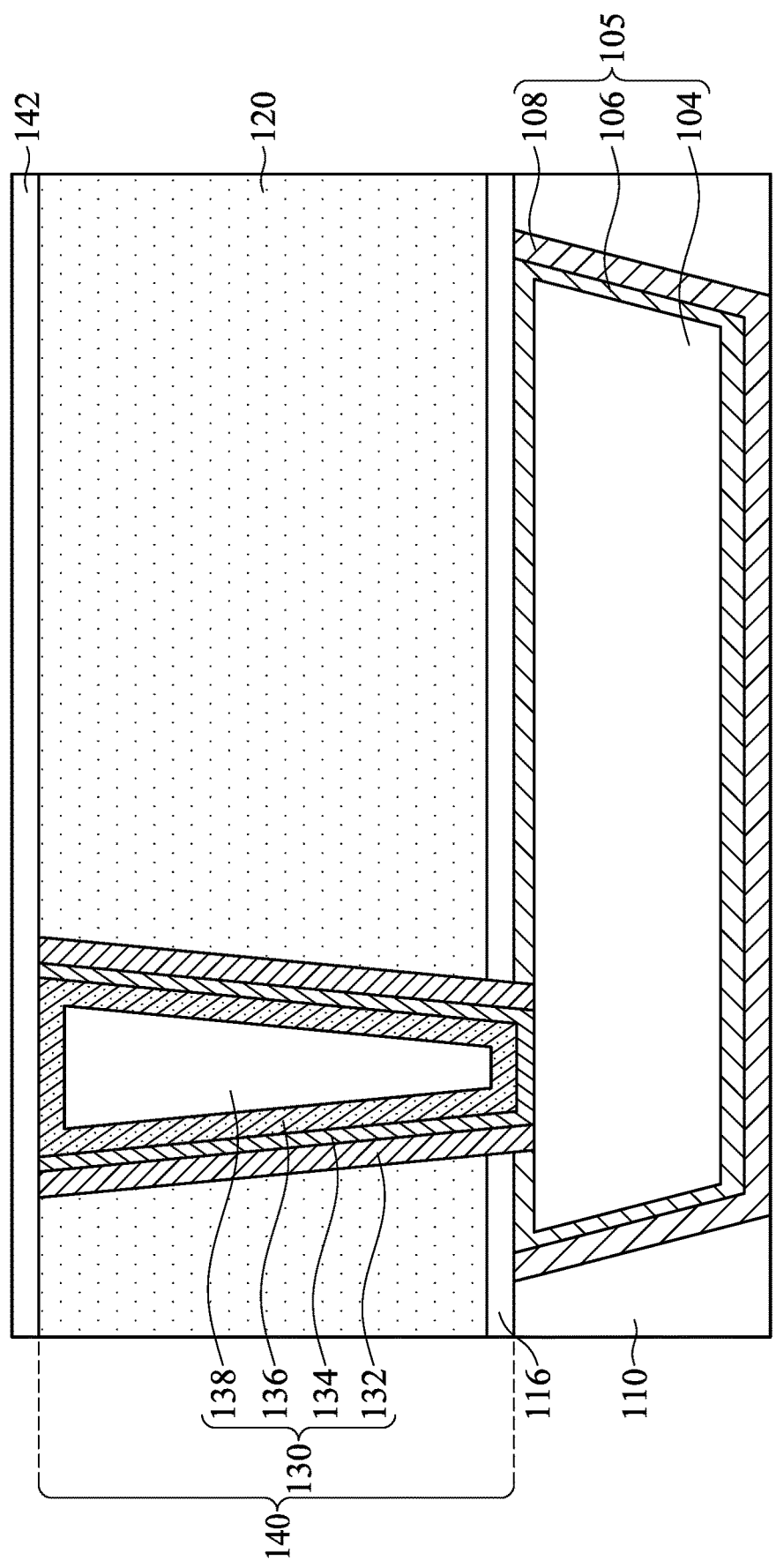
Figure 7C:
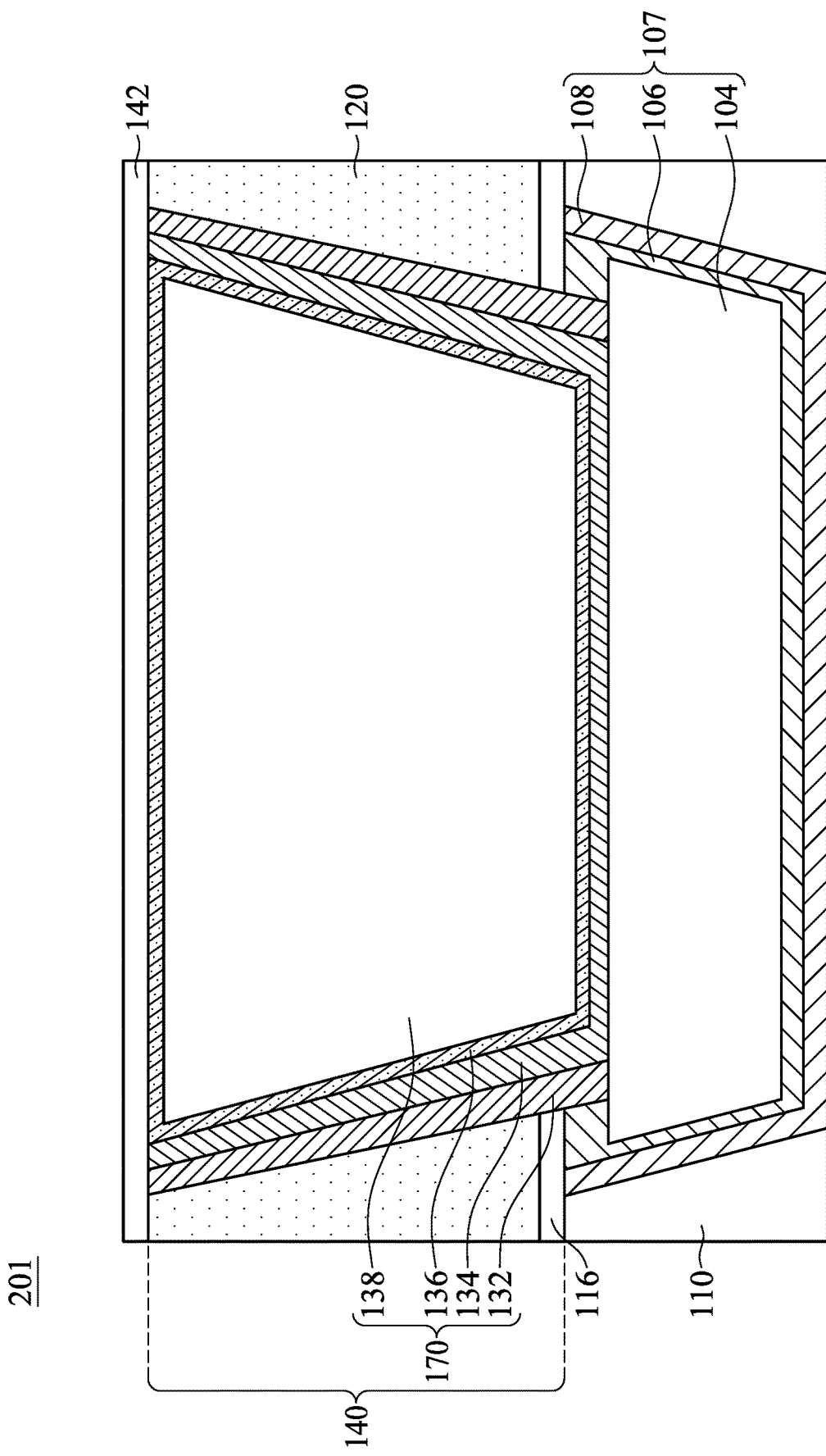

In FIGS. 7A, 7B, and 7C, an ESL 142 is formed over the interconnect level 140. The ESL 142 can be used for controlling subsequent etching processes to form openings for vias in an interconnect level subsequently formed over the interconnect level 140 (see below, FIG. 12). The ESL 142 may be formed using similar methods and materials as the ESL 116 as described above in respect to FIGS. 2A and 2B.

Figure 8A:
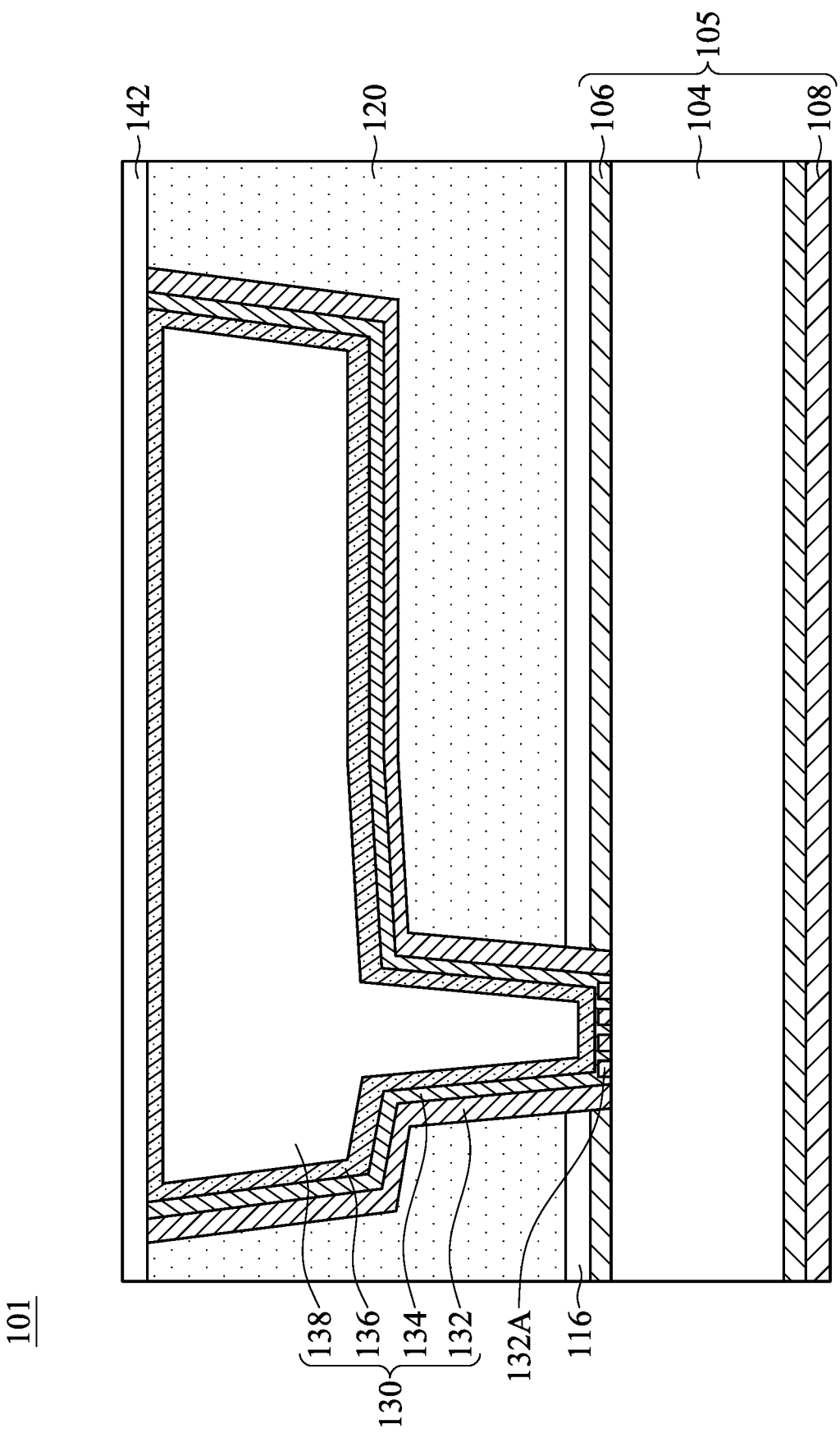
Figure 8B:
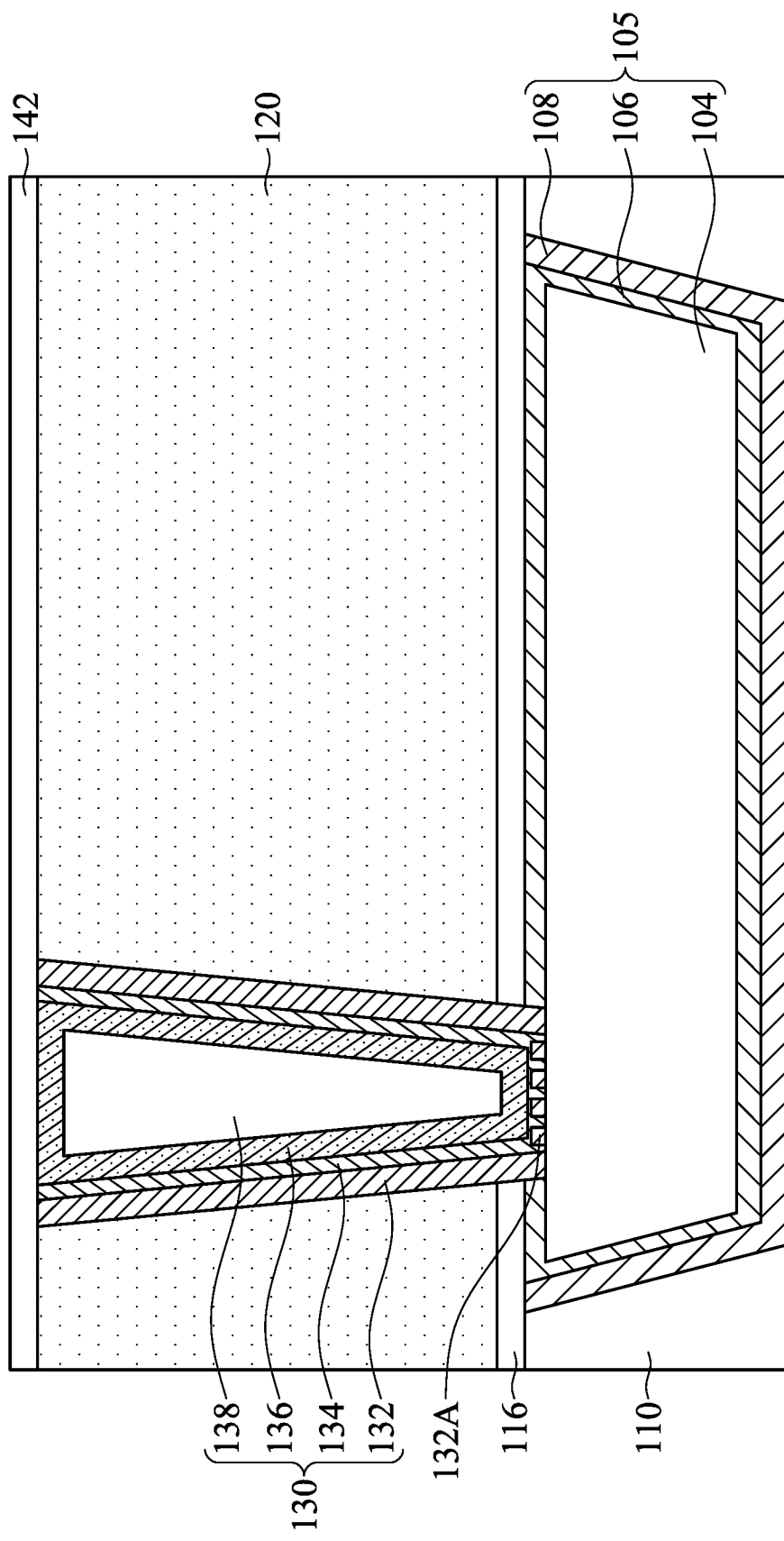

FIGS. 8A and 8B illustrate an embodiment following from FIGS. 4C and 4D. The bottom barrier layer 132A of the conductive feature 130 is interposed between a bottom surface of the outer liner 134 and the top surface of the conductive fill layer 104. The bottom barrier layer 132A may be discontinuous, which can decrease resistance between the outer liner 134 and conductive fill layer 104.

Figure 9A:
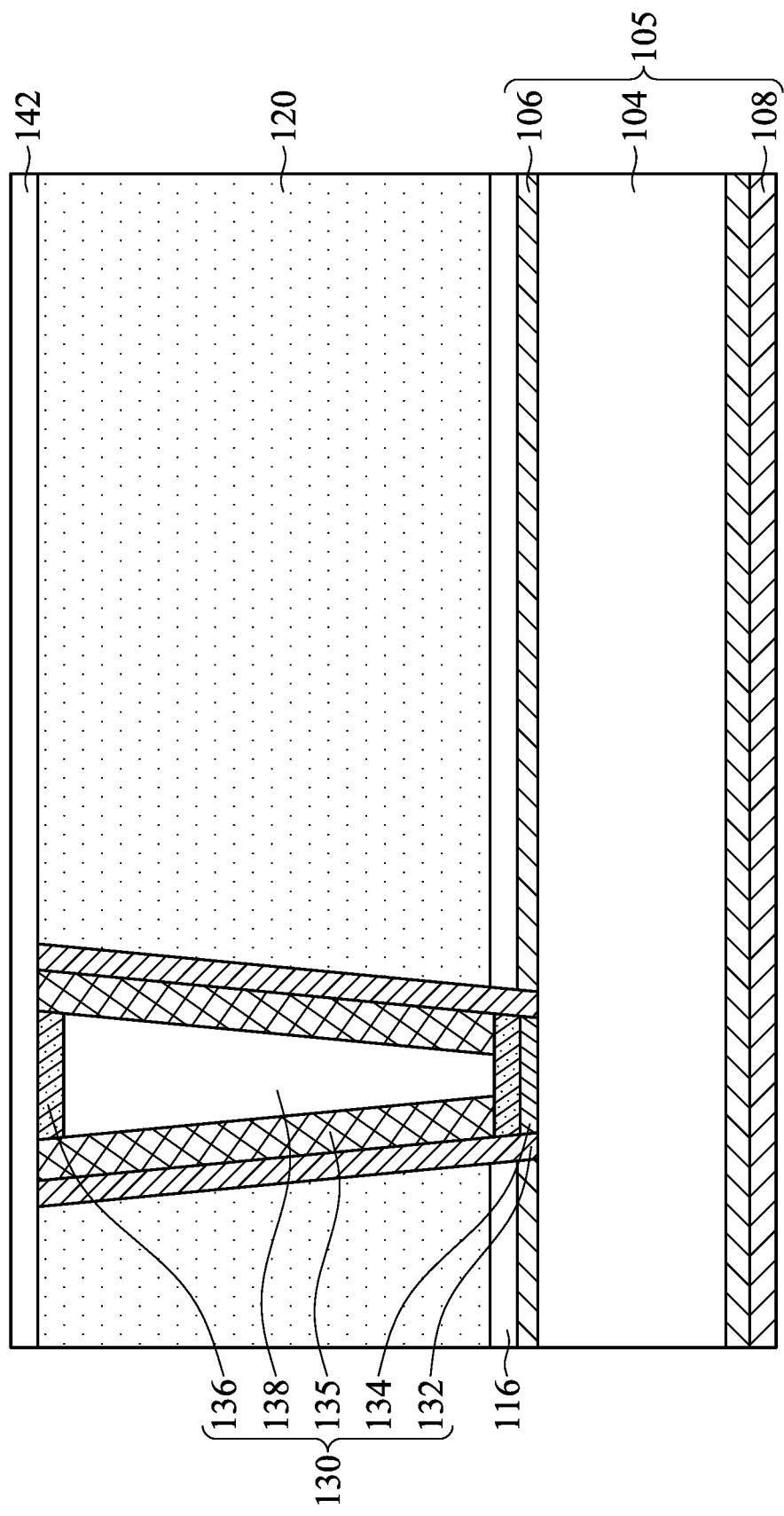
Figure 9B:
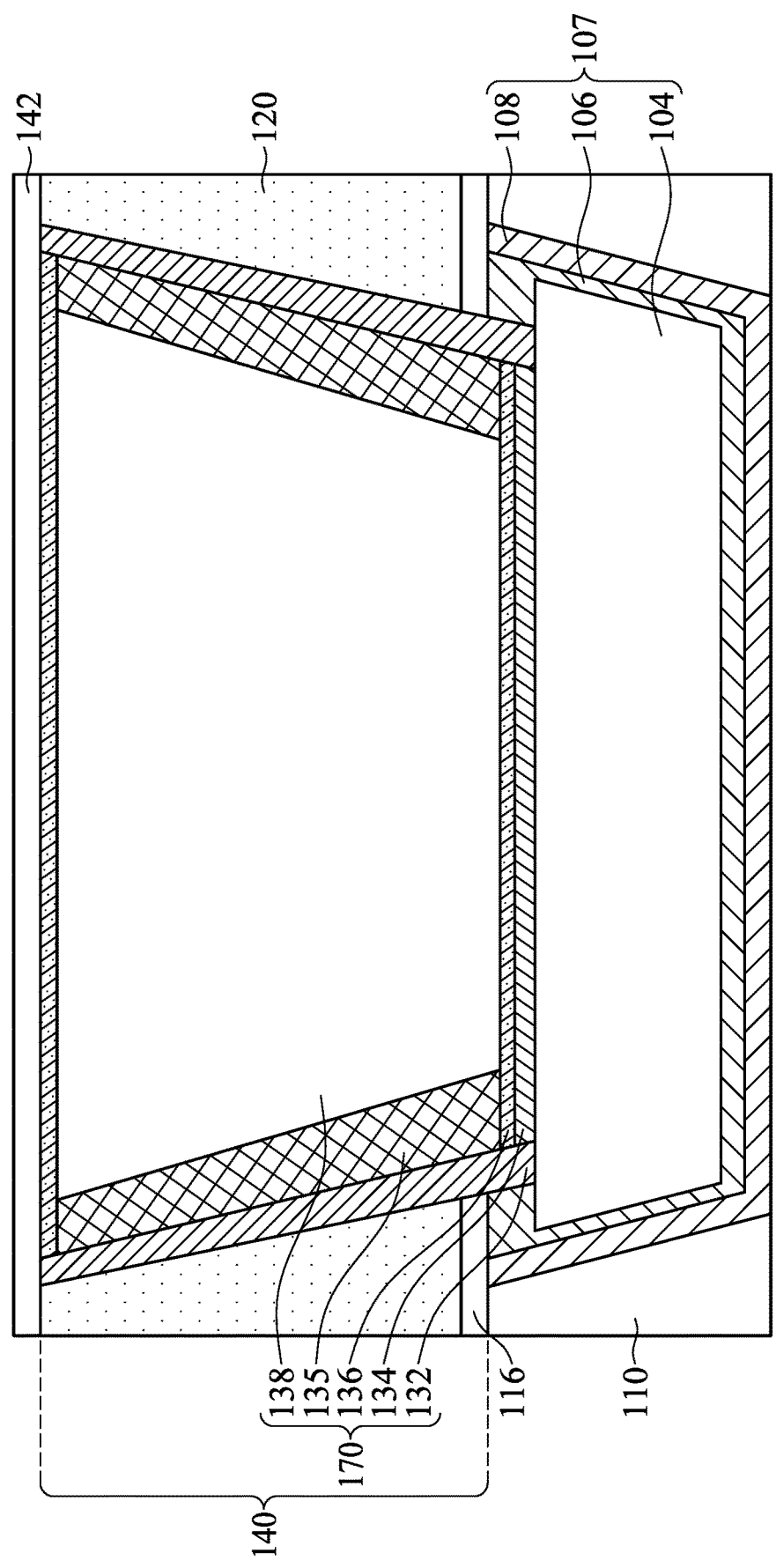

FIGS. 9A and 9B illustrate an embodiment in which a combined liner 135 is formed in the conductive features 130 and 170 by an intermixing of the outer liner 134 and the inner liner 136 along sidewalls of the barrier layer 132. In some embodiments in which the outer liner 134 comprises ruthenium and the inner liner 136 comprises cobalt, the combined liner 135 comprises intermixed ruthenium and cobalt. The combined liner 135 having intermixed ruthenium and cobalt may improve the efficiency and yield of filling the openings 124 and 126 with the conductive fill layer 138. In particular, in some embodiments in which the conductive fill layer 138 comprises Cu, the presence of ruthenium on the surface of the combined liner 135 provides improved deposition and reflow of the conductive fill layer 138 by having increased Cu dewettability from the combined liner 135. The combined liner 135 along sidewalls of the barrier layer 132 may be measured as having fully intermixed ruthenium and cobalt by, e.g., having overlaid intensity peaks in an energy-dispersive X-ray spectroscopy scan.

In some embodiments, the combined liner 135 is formed after forming the outer liner 134 and the inner liner 136 and before forming the conductive fill layer 138 by performing a hydrogen treatment such as a hydrogen soak treatment and/or a hydrogen plasma treatment on the semiconductor structure 100 (see above, FIG. 6A). During the hydrogen soak treatment, hydrogen gas diffuses into the combined liner 135 to repair deformities and reorient the molecules, which facilitates an intermixing between the outer liner 134 and the inner liner 136. The hydrogen soak treatment may be performed at an elevated temperature in a range of 200° C. to 500° C., and at an elevated pressure in a range of 10 Torr to 50 Torr. The hydrogen plasma treatment may also facilitate intermixing between the outer liner 134 and the inner liner 136. In addition, hydrogen ions react with the outer liner 134 and the inner liner 136 to remove carbon and oxygen impurities from within those layers while also increasing the metal diffusivity. In accordance with some embodiments, the hydrogen plasma treatment includes bombarding the semiconductor structure 100 with hydrogen plasma for a period in a range of 10 seconds to 120 seconds. The hydrogen plasma treatment may be performed at a temperature in a range of 150° C. to 400° C. and at a pressure in a range of 1 Torr to 10 Torr. The flow rate of hydrogen plasma may be in a range of 1000 sccm (standard cubic centimeters per minute) to 6000 sccm and last for a duration in a range of 10 seconds to 2 minutes.

As illustrated in FIGS. 9A and 9B, the combined liner 135 may be formed on sidewalls of the barrier layer 132 in the conductive features 130 and 170. Portions of the outer liner 134 and the inner liner 136 along bottom surfaces of the conductive features 130 and 170 may be partially intermixed, or may remain unmixed. Portions of the outer liner 134 and the inner liner 136 along bottom surfaces of the conductive features 130 and 170 may be measured as having partially intermixed ruthenium and cobalt by, e.g., having partially overlapping intensity peaks in an energy-dispersive X-ray spectroscopy scan. In some embodiments, the combined liner 135 has a thickness in a range of 10 Å to 20 Å on sidewalls of the conductive features 130 and 170 and a thickness in a range of 5 Å to 10 Å on bottom surfaces of the conductive features 130 and 170. At the bottom of the via portions of the conductive features 130 formed in the openings 124 (see above, FIGS. 5A and 5B), the conductive fill layer 138 may physically contact a portion of the inner liner 136, the portion of the inner liner 136 may physically contact a portion of the outer liner 134, and the portion of the outer liner 134 may physically contact the conductive fill layer 104.

Figure 10A:
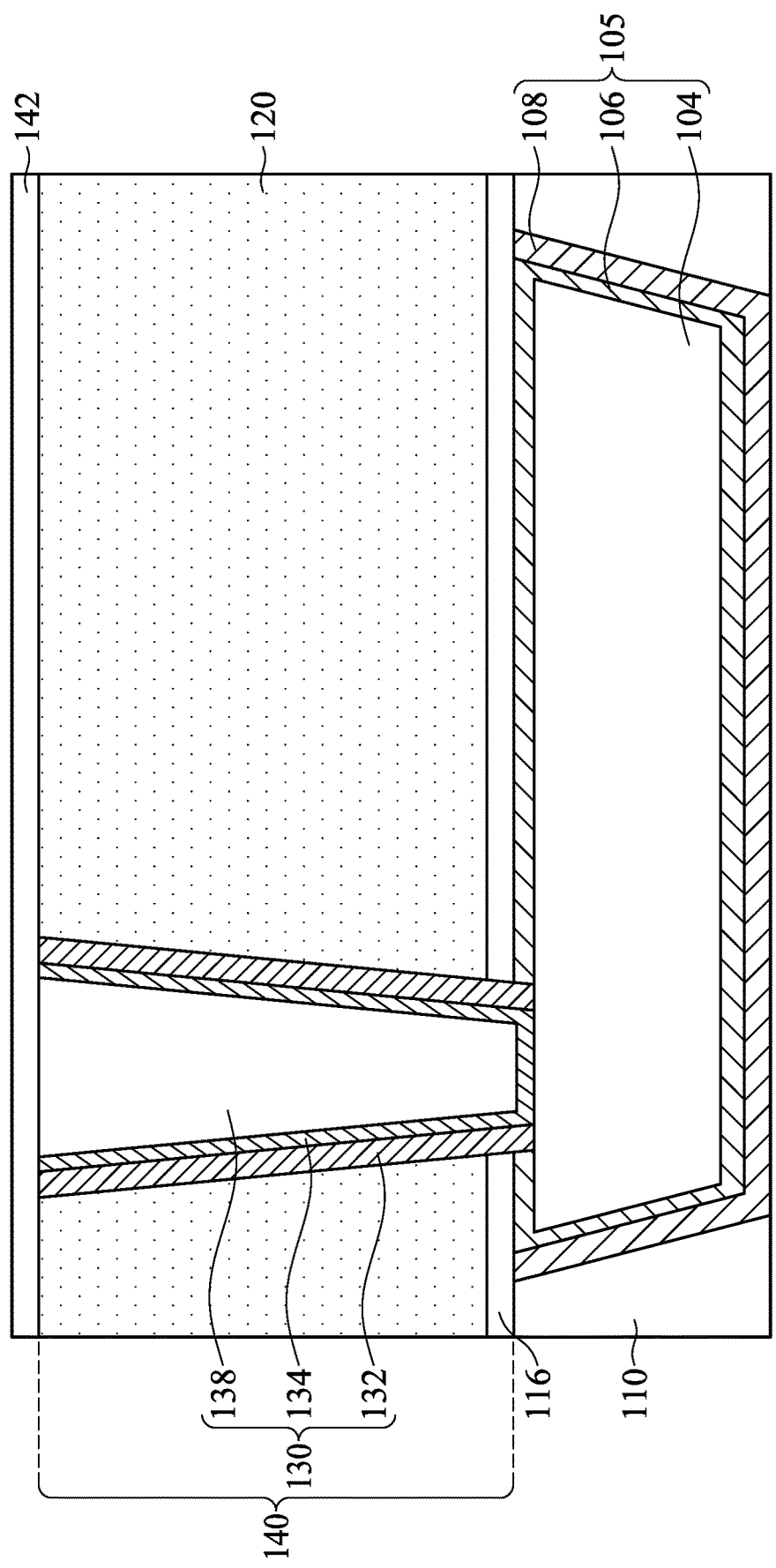
Figure 10B:
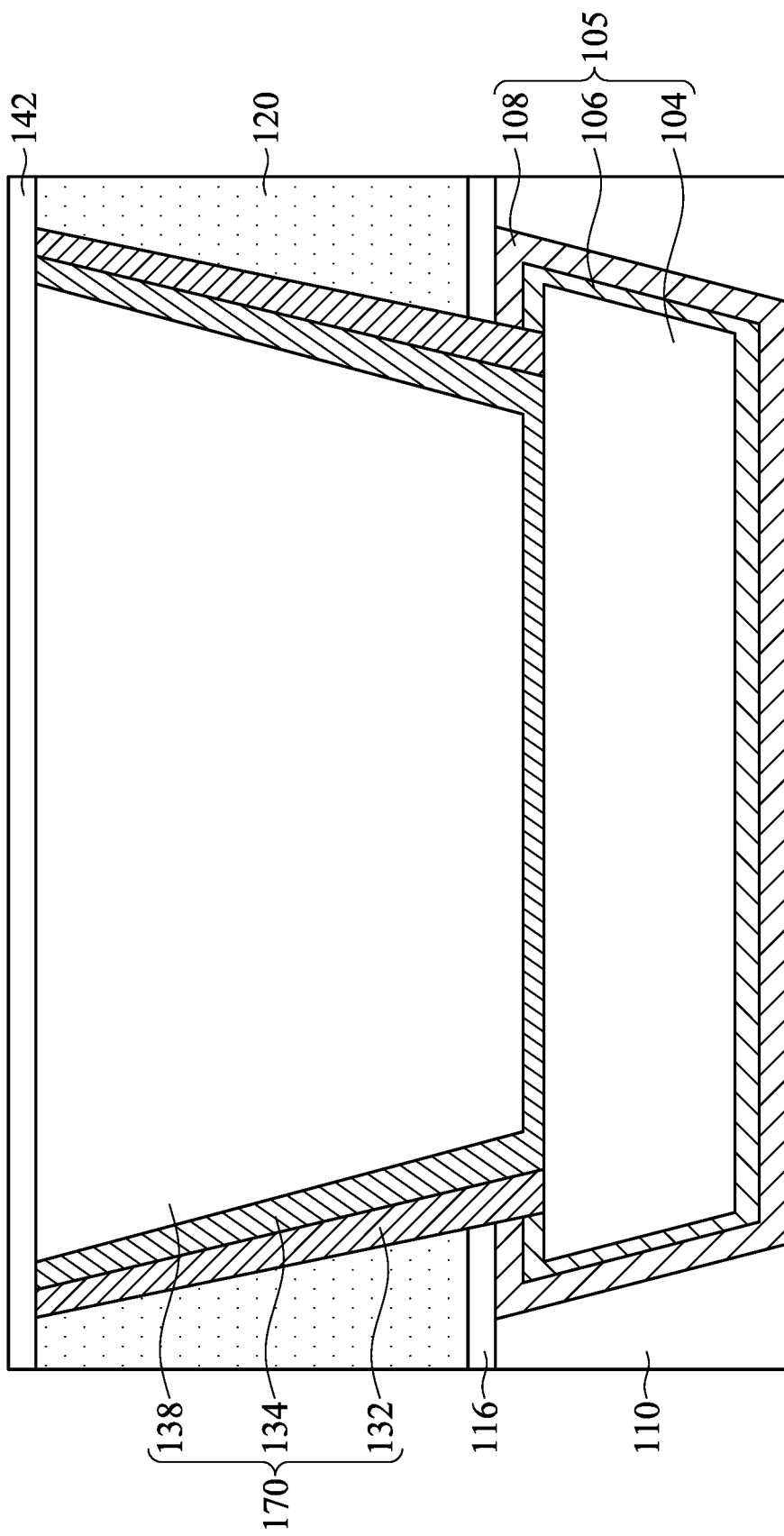

FIGS. 10A and 10B illustrate an embodiment in which the conductive fill layer 138 is formed directly on the outer liner 134 in the conductive features 130 and 170. The outer liner 134 may be formed to a thickness of 10 Å to 25 Å of a material such as, e.g., ruthenium on sidewalls and bottom surfaces of the opening 124 and on sidewalls and bottom surfaces of the opening 126, which may be advantageous by improving adhesion of the subsequently deposited conductive fill layer 138 to the barrier layer 132. Forming the outer liner 134 to a thickness less than 10 Å may be disadvantageous by leading to worse adhesion of the conductive fill layer 138 to the barrier layer 132. Forming the outer liner 134 to a thickness greater than 25 Å may be disadvantageous by leading to increased corrosion of the underlying conductive fill layer 104, which may increase device resistance.

Figure 11A:
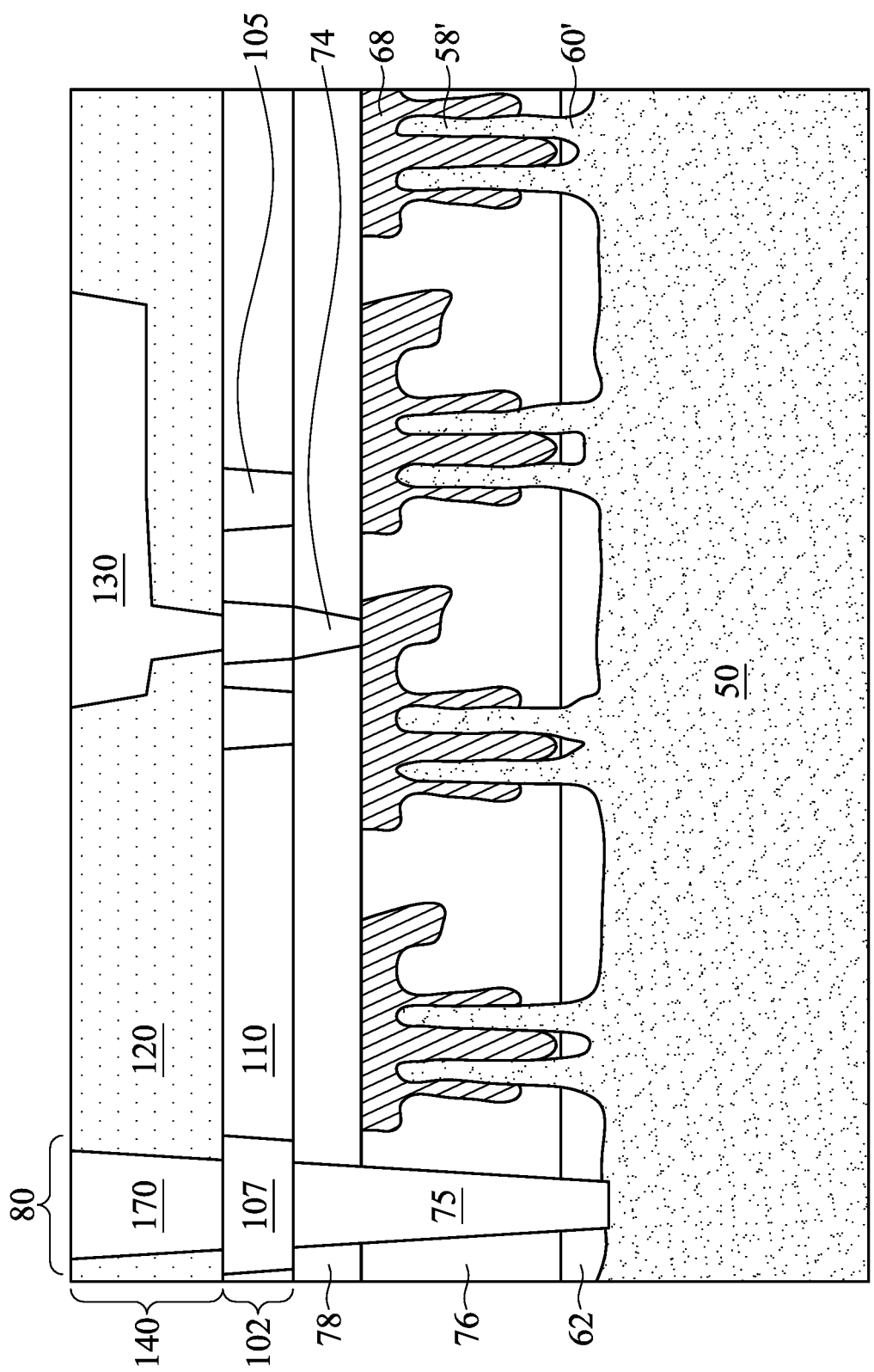
FIGS. 11A, 11B, and 11C illustrate cross-sectional views of semiconductor substrates and interconnect structures of integrated circuits, in accordance with some embodiments.
Figure 11B:
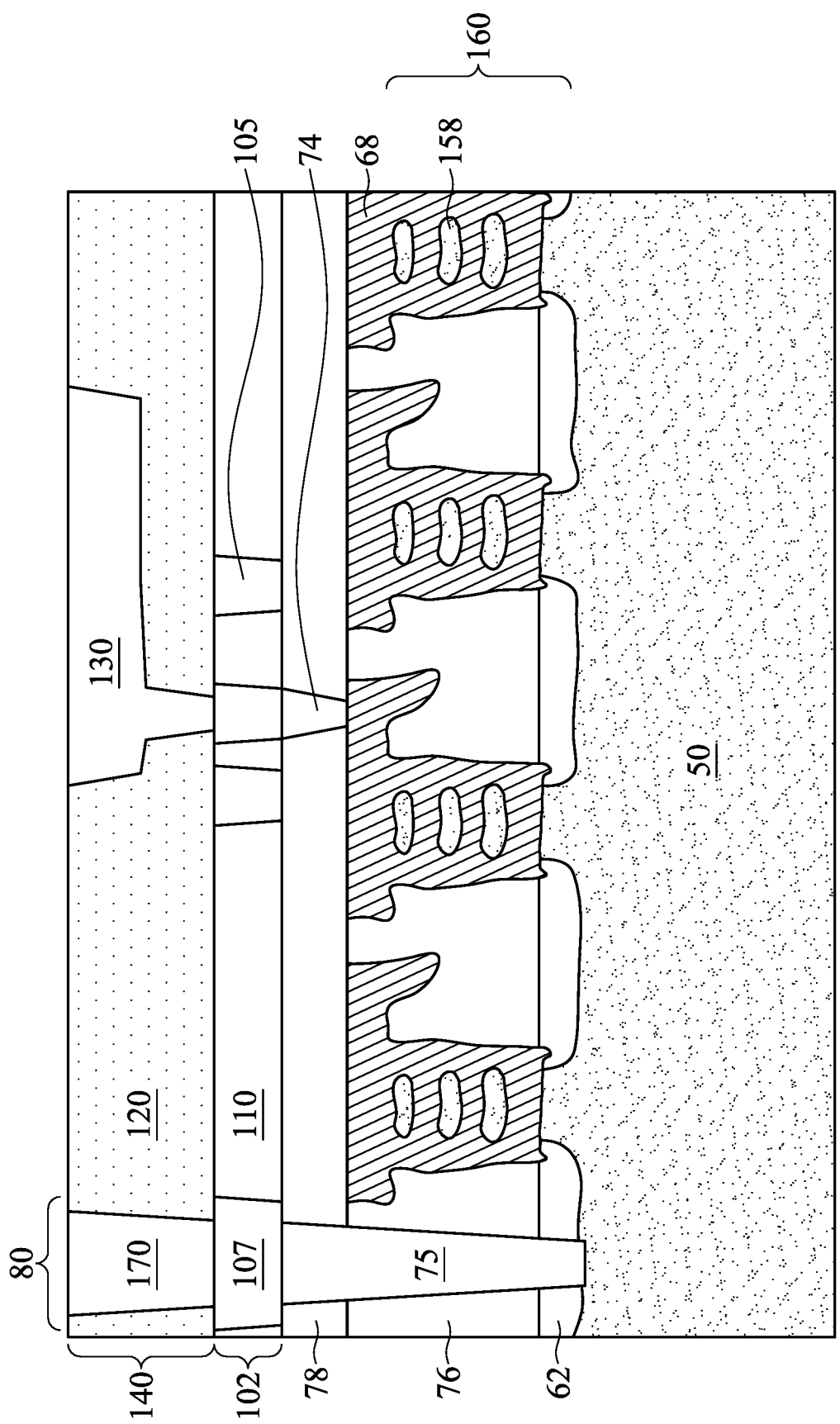
Figure 11C:
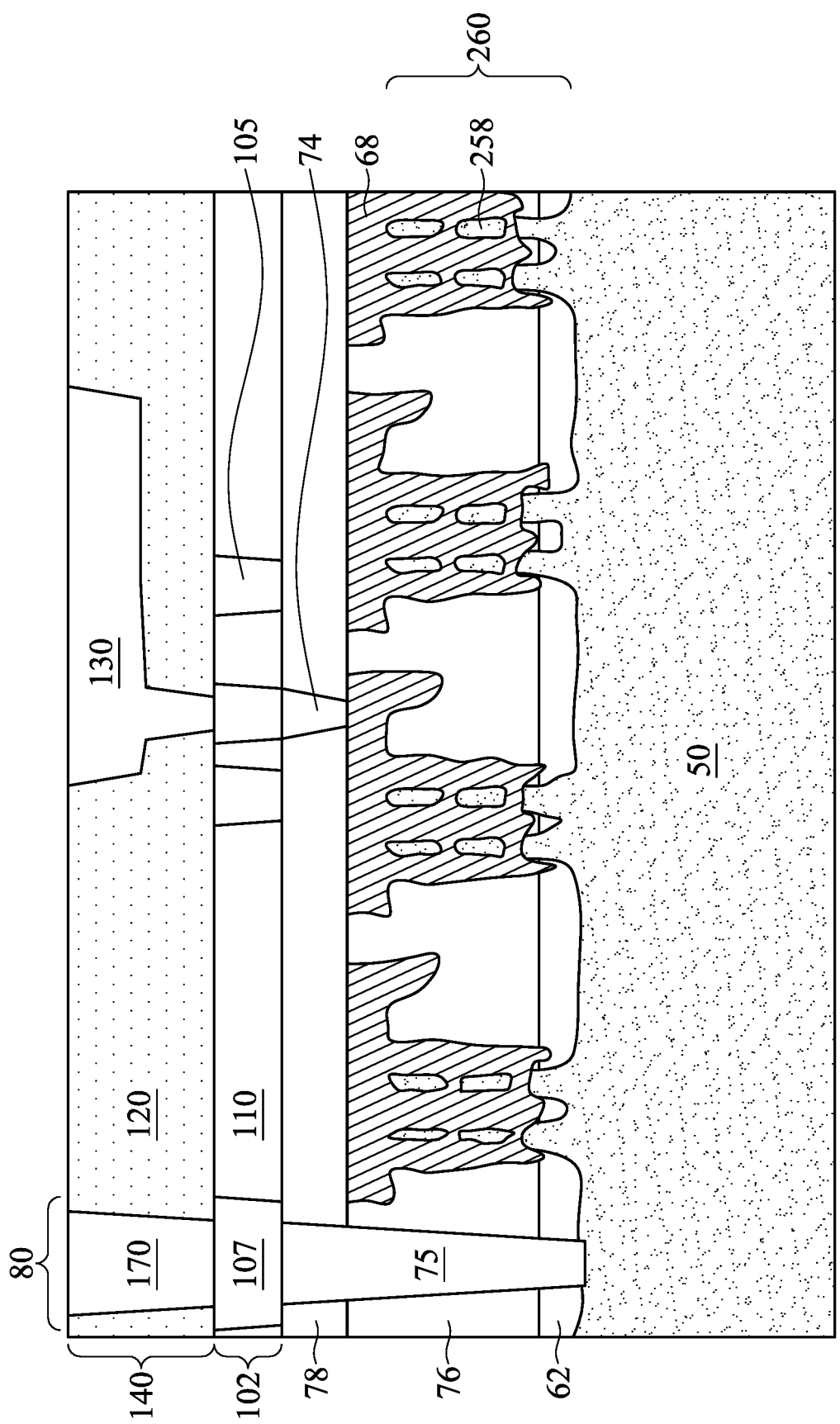

FIGS. 11A, 11B, and 11C illustrate cross-sectional views of embodiments in which the interconnect layers 102 and 140 are formed over different electronic devices. The example electronic device (FinFET 60) as illustrated in FIGS. 1A and 6A is provided for illustrative purposes only to further explain applications of the disclosed embodiments, and is not meant to limit the disclosed embodiments in any manner. FIG. 11A illustrates another configuration of a FinFET device 60' with double fins 58' being covered by gate structures 68. The disclosed FinFET embodiments could also be applied to nanostructure devices such as nanostructure (e.g., nanosheet, nanowire, gate-all-around, or the like) field effect transistors (nano-FETs). In a nano-FET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the nano-FET devices. FIG. 11B illustrates nanosheet devices 160 having nanosheet channel regions 158 being covered by gate structures 68, and FIG. 11C illustrates nanowire devices 260 having nanowire channel regions 258 being covered by gate structures 68. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Figure 12:
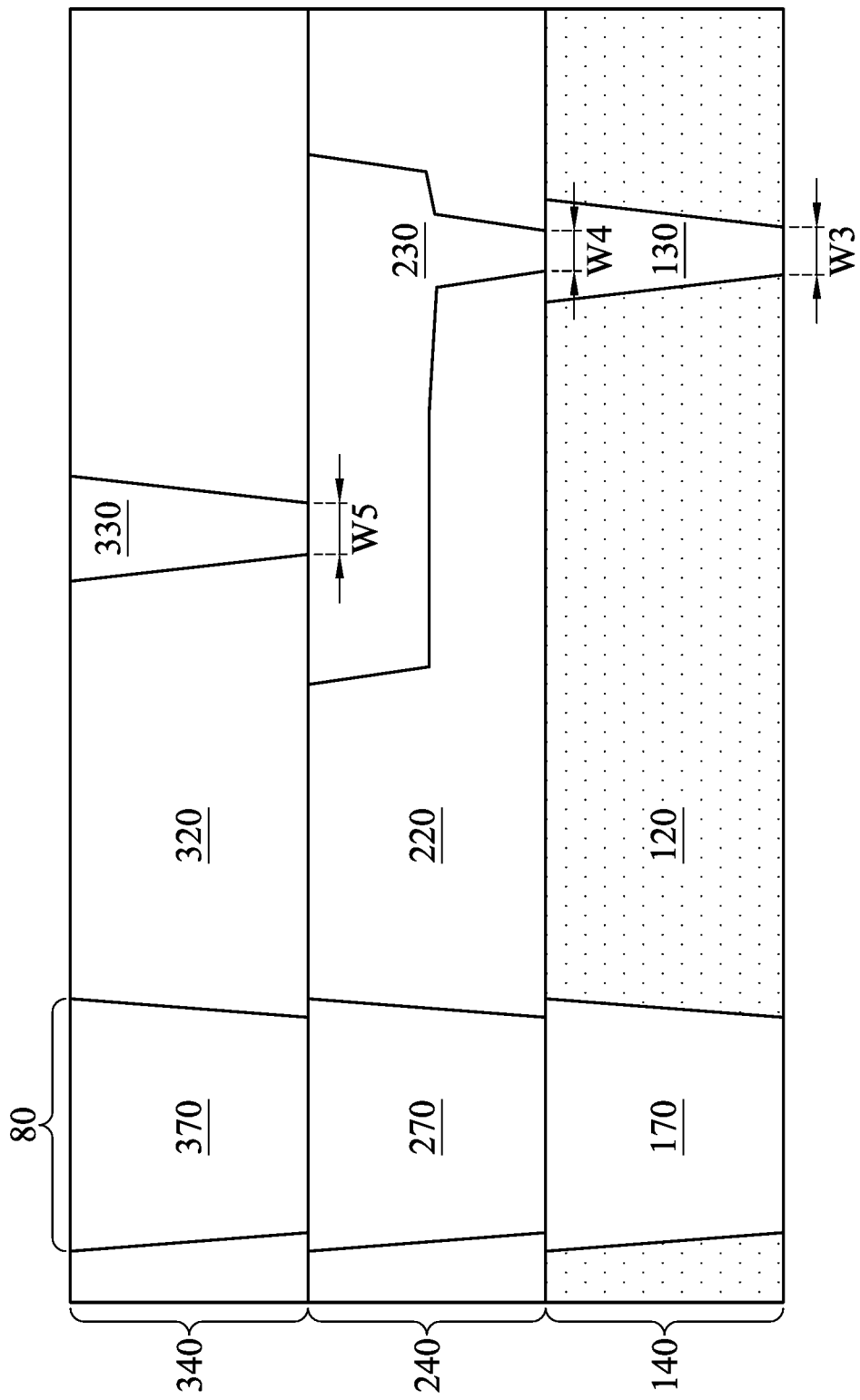
FIG. 12 illustrates a cross-sectional view of an interconnect structures at an intermediate stage of manufacturing, in accordance with some embodiments.

FIG. 12 illustrates a cross-sectional view of the interconnect level 140 with higher interconnect levels 240 and 340 formed on it along cross-section B-B' of FIG. 1B, in accordance with some embodiments. In embodiments illustrated in accordance with FIG. 12, various interconnect levels have similar features and may be formed using similar methods and materials. The dielectric layers 220 and 320 of the interconnect levels 240 and 340, respectively, may be formed using similar methods and materials as the dielectric layer 120, and the conductive features 230 and 270 of the interconnect level 240 and the conductive features 330 and 370 of the interconnect level 340 may be formed using similar methods and materials as the conductive features 130 and 170, as described above in respect to FIGS. 2A through 6D. However, it is understood that other embodiments may utilize alternate integration schemes wherein the various interconnect levels may use different features. For example, the conductive features 130 and 330 of the interconnect levels 140 and 340, respectively, are illustrated as having conductive line portions running perpendicular to the cross-section B-B', while the conductive feature 230 of the interconnect level 240 is illustrated as having a conductive line portion running along the cross-section B-B'. In other embodiments, the conductive features 130 and 330 of the interconnect levels 140 and 340 may have conductive line portions running along the cross-section B-B' and the conductive features 230 of the interconnect level 240 may have conductive line portions running perpendicular to the cross-section B-B'. Although shown as being formed in the same cross-section, it should be appreciated that each of the conductive features 130, 230, and 330 may be formed in different cross-sections, which may avoid shorting of the conductive features.

The conductive features of the various interconnect levels as illustrated in FIG. 12 may have different dimensions. For example, in some embodiments, the conductive feature 130 of the interconnect level 140 has a width W3 measured across a bottom surface in a range of 10 nm to 15 nm, the conductive feature 230 of the interconnect level 240 has a width W4 measured across a bottom surface in a range of 14 nm to 22 nm, and the conductive feature 330 of the interconnect level 340 has a width W5 measured across a bottom surface in a range of 12 nm to 16 nm.

Embodiments may provide advantages. Interconnect structures may be formed with conductive features having barrier layers formed to not cover the bottom surfaces of the conductive features to lower device resistance. The exposed bottom surface not covered by the barrier layer may be passivated, which can reduce corrosion from reactions between subsequently formed liner layers and the exposed bottom surface. Multiple liner layers may be formed over the barrier layer. The multiple liner layers may be intermixed on sidewalls of the conductive features to improve adhesion of a conductive fill material subsequently formed to fill the conductive features.

In accordance with an embodiment, a method of manufacturing a structure includes: forming an opening through a dielectric layer, the opening exposing a top surface of a first conductive feature; forming a barrier layer on sidewalls of the opening; passivating the exposed top surface of the first conductive feature with a treatment process; forming a liner layer over the barrier layer, the liner layer including ruthenium; and filling the opening with a conductive material. In an embodiment, the treatment process is a plasma treatment including $H_2$. In an embodiment, the plasma treatment is performed for a time in a range of 10 seconds to 2 minutes. In an embodiment, the plasma treatment uses a power supply power in a range of 100 W to 800 W. In an embodiment, forming the liner layer includes: forming an outer liner layer over the barrier layer and the exposed top surface of the first conductive feature, the outer liner layer being ruthenium; and forming an inner liner layer over the outer liner layer, the inner liner layer being cobalt. In an embodiment, the method further includes forming a capping layer over the conductive material, the capping layer being cobalt. In an embodiment, forming the liner layer includes forming a combined liner layer on sidewalls of the barrier layer, the combined liner layer including intermixed ruthenium and cobalt. In an embodiment, forming the combined liner layer includes performing a hydrogen soak treatment on a ruthenium layer and on a cobalt layer, the cobalt layer being on the ruthenium layer.

In accordance with another embodiment, a method of manufacturing a structure includes: forming an etch stop layer (ESL) on an interconnect level, the interconnect level including a first conductive feature; depositing a dielectric layer on the ESL; forming a trench in the dielectric layer; forming a hole through the dielectric layer and the ESL into a first conductive feature, wherein a bottom surface of the hole exposes a conductive fill layer of the first conductive feature; and forming a second conductive feature. Forming the second conductive feature includes: depositing a barrier layer on sidewalls of the hole and on sidewalls and a bottom surface of the trench; after depositing the barrier layer, performing a plasma treatment on an exposed top surface of the conductive fill layer; forming an outer liner conformally in the hole and the trench, the outer liner including ruthenium; forming an inner liner on the outer liner; and forming a conductive fill layer on the inner liner. In an embodiment, forming the inner liner further includes forming an upper portion of the inner liner on a top surface of the conductive fill layer. In an embodiment, the plasma treatment includes $H_2$. In an embodiment, the plasma treatment is performed at a power in a range of 100 W to 800 W. In an embodiment, the plasma treatment is performed for a duration in a range of 10 seconds to 2 minutes. In an embodiment, forming the barrier layer further includes forming a bottom portion of the barrier layer on a bottom surface of the second conductive feature, the bottom portion of the barrier layer being discontinuous. In an embodiment, the bottom portion of the barrier layer has a thickness in a range of 3 Å to 8 Å. In an embodiment, the outer liner has a thickness in a range of 5 Å to 15 Å. In an embodiment, the inner liner has a thickness in a range of 5 Å to 15 Å.

In accordance with yet another embodiment, a semiconductor structure includes: a first conductive feature; a dielectric layer on the first conductive feature; and a second conductive feature in the dielectric layer, the second conductive feature including: a barrier layer, at least a portion of the barrier layer being sidewalls of the second conductive feature; a liner layer on the barrier layer, the liner layer being in contact with at least a portion of the first conductive feature; and a conductive fill layer on the liner layer. In an embodiment, a bottom portion of the barrier layer is on a bottom surface of the second conductive feature, the bottom portion of the barrier layer being discontinuous. In an embodiment, the liner layer includes: a combined liner layer along sidewalls of the barrier layer, the combined liner layer including intermixed ruthenium and cobalt; an outer liner portion on a bottom surface of the second conductive feature, the outer liner portion being ruthenium; and an inner liner portion on the outer liner portion, the inner liner portion being cobalt.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a structure, the method comprising:
    forming an opening through a dielectric layer, the opening exposing a top surface of a first conductive feature;
    forming a sacrificial layer on the exposed top surface of the first conductive feature;
    forming a barrier layer on sidewalls of the opening;
    after forming the barrier layer, removing the sacrificial layer;
    passivating the exposed top surface of the first conductive feature with a treatment process;
    forming a liner layer over the barrier layer, the liner layer comprising ruthenium; and
    filling the opening with a conductive material.

2. The method of claim 1, wherein the treatment process is a plasma treatment comprising $H_2$.

3. The method of claim 2, wherein the plasma treatment is performed for a time in a range of 10 seconds to 2 minutes.

4. The method of claim 2, wherein the plasma treatment uses a power supply power in a range of 100 W to 800 W.

5. The method of claim 1, wherein forming the liner layer comprises:
    forming an outer liner layer over the barrier layer and the exposed top surface of the first conductive feature, the outer liner layer being ruthenium; and
    forming an inner liner layer over the outer liner layer, the inner liner layer being cobalt.

6. The method of claim 5, further comprising forming a capping layer over the conductive material, the capping layer being cobalt.

7. The method of claim 1, wherein forming the liner layer comprises forming a combined liner layer on sidewalls of the barrier layer, the combined liner layer comprising intermixed ruthenium and cobalt.

8. The method of claim 7, wherein forming the combined liner layer comprises performing a hydrogen soak treatment on a ruthenium layer and on a cobalt layer, the cobalt layer being on the ruthenium layer.

9. A method of manufacturing a structure, the method comprising:
    forming an etch stop layer (ESL) on an interconnect level, the interconnect level comprising a first conductive feature;
    depositing a dielectric layer on the ESL;
    forming a trench in the dielectric layer;
    forming a hole through the dielectric layer and the ESL into the first conductive feature, wherein a bottom surface of the hole exposes a conductive fill layer of the first conductive feature; and
    forming a second conductive feature, the forming the second conductive feature comprising:
        depositing a barrier layer on sidewalls of the hole and on sidewalls and a bottom surface of the trench;
        after depositing the barrier layer, performing a plasma treatment on an exposed top surface of the conductive fill layer;
        forming an outer liner conformally in the hole and the trench, the outer liner comprising ruthenium;
        forming an inner liner on the outer liner; and
        forming a conductive fill layer of the second conductive feature on the inner liner.

10. The method of claim 9, wherein forming the inner liner further comprises forming an upper portion of the inner liner on a top surface of the conductive fill layer of the first conductive feature.

11. The method of claim 9, wherein the plasma treatment comprises $H_2$.

12. The method of claim 9, wherein the plasma treatment is performed at a power in a range of 100 W to 800 W.

13. The method of claim 9, wherein the plasma treatment is performed for a duration in a range of 10 seconds to 2 minutes.

14. The method of claim 9, wherein forming the barrier layer further comprises forming a bottom portion of the barrier layer on a bottom surface of the second conductive feature, the bottom portion of the barrier layer being discontinuous.

15. The method of claim 14, wherein the bottom portion of the barrier layer has a thickness in a range of 3 Å to 8 Å.

16. The method of claim 9, wherein the outer liner has a thickness in a range of 5 Å to 15 Å.

17. The method of claim 9, wherein the inner liner has a thickness in a range of 5 Å to 15 Å.

18. A semiconductor structure, comprising:
    a first conductive feature;
    a dielectric layer on the first conductive feature; and
    a second conductive feature in the dielectric layer, the second conductive feature comprising:

a barrier layer, at least a portion of the barrier layer being sidewalls of the second conductive feature, a bottom portion of the barrier layer being part of a bottom surface of the second conductive feature, the bottom portion of the barrier layer being discontinuous;

a liner layer on the barrier layer, the liner layer being in contact with at least a portion of the first conductive feature; and a conductive fill layer on the liner layer.

19. The semiconductor structure of claim 18, wherein the liner layer comprises:

a combined liner layer along sidewalls of the barrier layer, the combined liner layer comprising intermixed ruthenium and cobalt;

an outer liner portion on a bottom surface of the second conductive feature, the outer liner portion being ruthenium; and an inner liner portion on the outer liner portion, the inner liner portion being cobalt.

20. The semiconductor structure of claim 18, wherein the barrier layer comprises tantalum nitride.

\* \* \* \* \*